(12) United States Patent
Tuccio

(10) Patent No.: US 6,496,951 B1
(45) Date of Patent: Dec. 17, 2002

(54) METHOD FOR TESTING SIGNAL INTEGRITY IN A DATA STORAGE SYSTEM

(75) Inventor: William R. Tuccio, Sutton, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/474,633

(22) Filed: Dec. 29, 1999

(51) Int. Cl.[7] ............................................. G11C 29/00
(52) U.S. Cl. ........................................ 714/718; 365/201
(58) Field of Search ........................... 714/718; 365/201

(56) References Cited

U.S. PATENT DOCUMENTS

| | | | |
|---|---|---|---|
| 5,206,939 A | | 4/1993 | Yanai et al. .................... 711/4 |
| 5,574,855 A | * | 11/1996 | Rosich et al. .................. 714/41 |
| 5,953,352 A | * | 9/1999 | Meyer ........................ 714/820 |
| 6,327,676 B1 | * | 12/2001 | Abramov et al. ............. 714/37 |

OTHER PUBLICATIONS

Co–Pending patent application S/N 09/474,886 Entitled "Method and Apparatus for Transmitting Fibre–Channel and Non–Fibre Channel Signals", filed Dec. 29, 1999 and Assigned to Art Unit 2874.
Co–Pending patent application S/N 09/473,668 Entitled "Fibre Channel Data Storage System", filed Dec. 29, 1999 and Assigned to Art Unit 2753.
Co–Pending patent application S/N 09/474,112 Entitled "Fibre Channel Data Storage System Fail–Over Mechanism", filed Dec. 29, 1999 and Assigned to Art Unit 2782.
Co–Pending patent application S/N 09/474,500 Entitled Fibre Channel Data Storage System Having Improved Rear–End I/O Adapted HUB, filed Dec. 29, 1999 and Assigned to Art Unit 2753.
Co–Pending patent application S/N 09/474,384 Entitled "Fibre Channel Data Storage System Having Improved Front–End I/O Adapted HUB", filed Dec. 29, 1999 and Assigned to Art Unit 2753.

* cited by examiner

Primary Examiner—Albert Decady
Assistant Examiner—Shelly A Chase
(74) Attorney, Agent, or Firm—Daly, Crowley & Mofford, LLP

(57) ABSTRACT

A method for testing a data storage system, such system having a host computer coupled to a bank of disk drives through a system interface. The interface includes a plurality of directors and memories interconnected by a plurality of busses for controlling data transfer between the host computer and the bank of disk drives as such data passes through the memories. A portion of the directors is coupled to the host computer. The method includes providing a test printed circuit board having input ports adapted for plugging into a system printed circuit board, such test printed circuit board having a selector section adapted to couple any one of the inputs thereof to a test output on the test printed circuit board. The method includes the steps of: (a) prior to a test mode, removing a director or memory and replacing such removed director or memory with the test printed circuit board; (b) operating the system with the test printed circuit board; (c) selectively coupling the inputs of the test printed circuit board to the test output to examine a signal waveform produced at the test port; and (d) repeating steps (a–c).

3 Claims, 24 Drawing Sheets

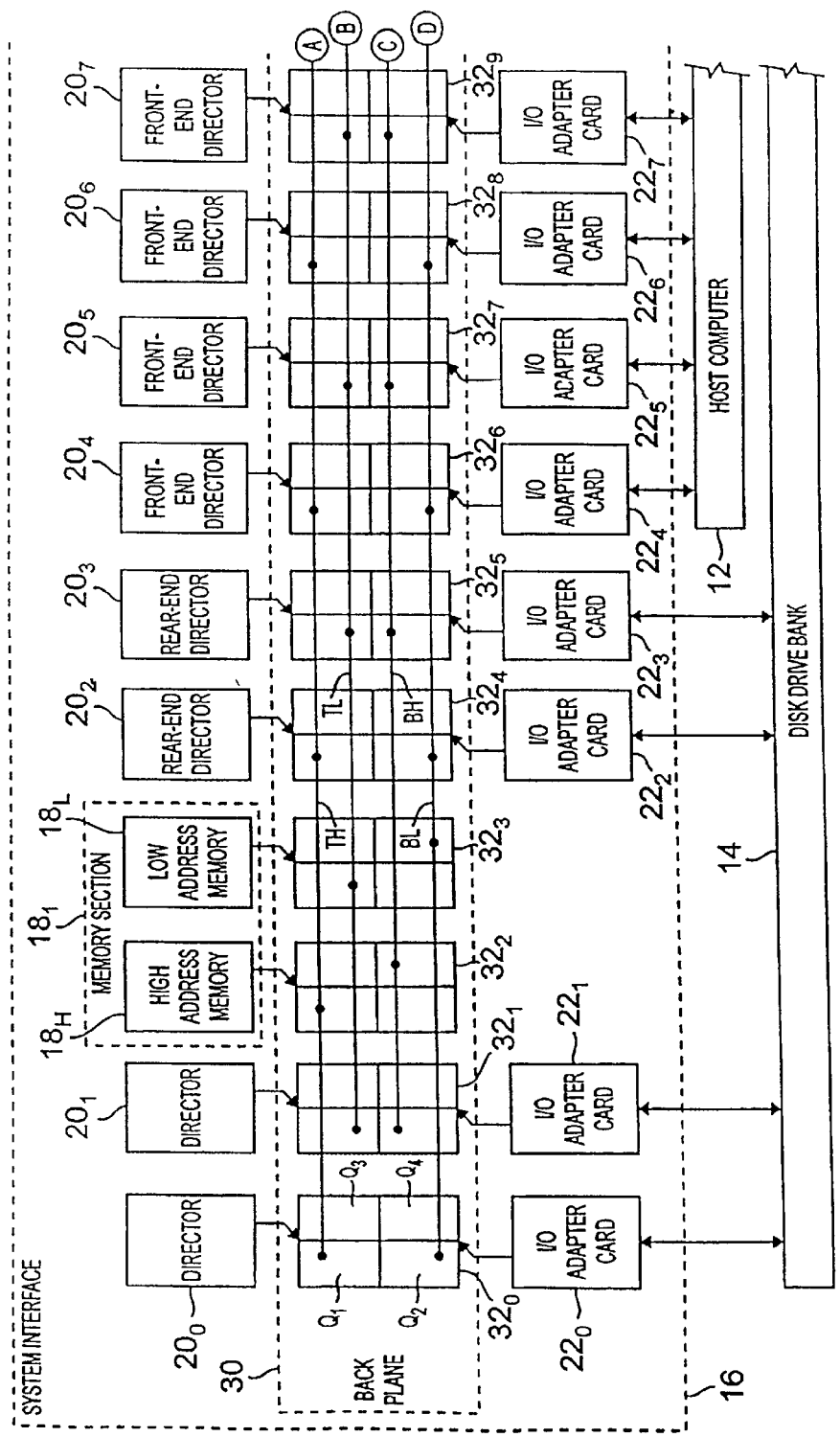

METHOD FOR TESTING SIGNAL INTEGRITY IN A DATA STORAGE SYSTEM

BACKGROUND OF THE INVENTION

This invention relates generally to data storage systems and more particularly to data storage systems having a plurality of magnetic storage disk drives in a redundancy arrangement whereby the disk drives are controllable by first disk controllers and second disk controllers. Still more particularly, the invention also relates to systems of such type wherein the disk drives are coupled to the disk controllers through a series, unidirectional, "ring" or, fiber channel protocol, communication system.

As is known in the art, in one type of data storage system, data is stored in a bank of magnetic storage disk drives. The disk drives, and their coupled interfaces, are arranged in sets, each set being controlled by a first disk controller and a second disk controller. More particularly, in order to enable the set of disk drives to operate in the event that there is a failure of the first disk controller, each set is also coupled to a second, or redundant disk controller. Therefore, if either the first or second disk controller fails, the set of disk drives is accessible by the other one of the disk controllers.

While today most disk storage systems of this type use a Small Computer System Interconnection (SCSI) protocol, in order to operate with higher data rates, other protocols are being introduced. One higher data rate protocol is sometimes referred to as a fibre channel (FC) protocol. Such FC channel protocol uses a series, unidirectional, "ring" communication system. In order to provide for redundancy, that is, to enable use of the set of disk drives in the event that the first disk controller fails, as discussed above, the set is coupled to the second, or redundant disk controller, using a separate, independent, "ring", or fibre channel communication protocol. Thus, two fibre channels are provided for each set of disk drives and their disk interfaces; a first fibre channel and a second fibre channel.

As is also known, when using the fibre channel communication protocol, if any element in the channel becomes inoperative, the entire channel becomes inoperative. That is, if the first disk controller becomes inoperative, or if any one of the disk drives in the set coupled to the first channel becomes inoperative (i.e., as where the disk interface fails, the disk interface is inoperative, or removed with its coupled disk drive, or where the disk drive coupled thereto fails, or is removed), the first fibre channel, is "broken", or open, and becomes inoperative. The data stored in the entire portion of the set of disk drives coupled to the first disk channel is therefore unavailable until the inoperative first disk controller or inoperative disk drive is replaced. This is true with either the first channel or the second channel. One technique suggested to solve this problem is through the use of a switch, sometimes referred to as an LRC (i.e., a loop resiliency circuit) switch. Such LRC switch is used to remove an inoperative disk drive from its channel.

In one suggested arrangement, a printed circuit board is provided for each disk drive. The printed circuit board has a pair of LRCs, one for the first channel and one for the second channel. Thus, the open channel may be "closed" in the event of an inoperative disk drive by placing the LRC thereof in a by-pass condition. While such suggested technique solves the inoperative disk drive, or open channel problem, if one of the pair of LRCs fails, the entire printed circuit board having the pair of LRCs must be replaced thereby disrupting both the first and second channels; and, hence, disrupting the operation of the entire data storage system.

One technique suggested to solve this disruption problem requires n LRC switches (where n is the number of disk drives in the set) in the first channel, i.e., one LRC for each one the n disk drives in the set and another n LRC switches in the second channel for each one of the n disk drives in the second channel. The first channel set of n LRCs is mounted on one printed circuit board and the second channel set of n LRCs is mounted on a different printed circuit board. A backplane is used to interconnect the two LRC printed circuit boards, the associated selectors, or multiplexers, and the disk drives. In order to provide the requisite serial, or sequential, fibre channel connections, an elaborate, complex, fan-out wiring arrangement has been suggested for the backplane. Further, the slots provided for the two LRC boards eliminates two disk drives, and the disk interfaces which would otherwise be plugged into these two slots of the backplane.

Another fibre channel arrangement is described in U.S. Pat. No. 5,729,763 entitled "Data Storage System", inventor Eli Leshem, issued Mar. 17, 1998, assigned to the same assignee as the present invention.

SUMMARY OF THE INVENTION

In accordance with the present invention, a method is provided for testing a data storage system, such system having a host computer coupled to a bank of disk drives through a system interface. The interface includes a plurality of directors and memories interconnected by a plurality of busses for controlling data transfer between the host computer and the bank of disk drives as such data passes through the memories. A portion of the directors is coupled to the host computer. The method includes providing a test printed circuit board having input ports adapted for plugging system printed circuit board, such test printed circuit board having a selector section adapted to couple any one of the inputs thereof to a test port on the test printed circuit board. The method includes the steps of: (a) prior to a test mode, removing a director or memory and replacing such removed director or memory with the test printed circuit board; (b) operating the system with the test printed circuit board; (c) selectively coupling the inputs of the test printed circuit board to the test output to examine a signal waveform produced at the test port; and (d) repeating steps (a–c).

In one embodiment of the invention, each one of the directors, memories and the test printed circuit board is adapted to be plugged into a corresponding one of a plurality of slots of system printed circuit board. Each one of the slots has a plurality of pins connected to the busses. When one of the directors or memories is replaced with the test printed circuit board, a signal at each one of the pins is coupled to the test port. After testing the signal at each of the pins in the slot, the test printed circuit board is removed from such slot, said one of the directors is plugged into such slot, and the test printed circuit board is used to replace another one of the plugged directors or memories.

BRIEF DESCRIPTION OF THE DRAWINGS

These and other features of the invention will become more readily apparent from the follow detailed description when read together with the accompanying drawings, in which.

DESCRIPTION OF THE PREFERRED EMBODIMENTS

OVERALL SYSTEM

Figure 1:
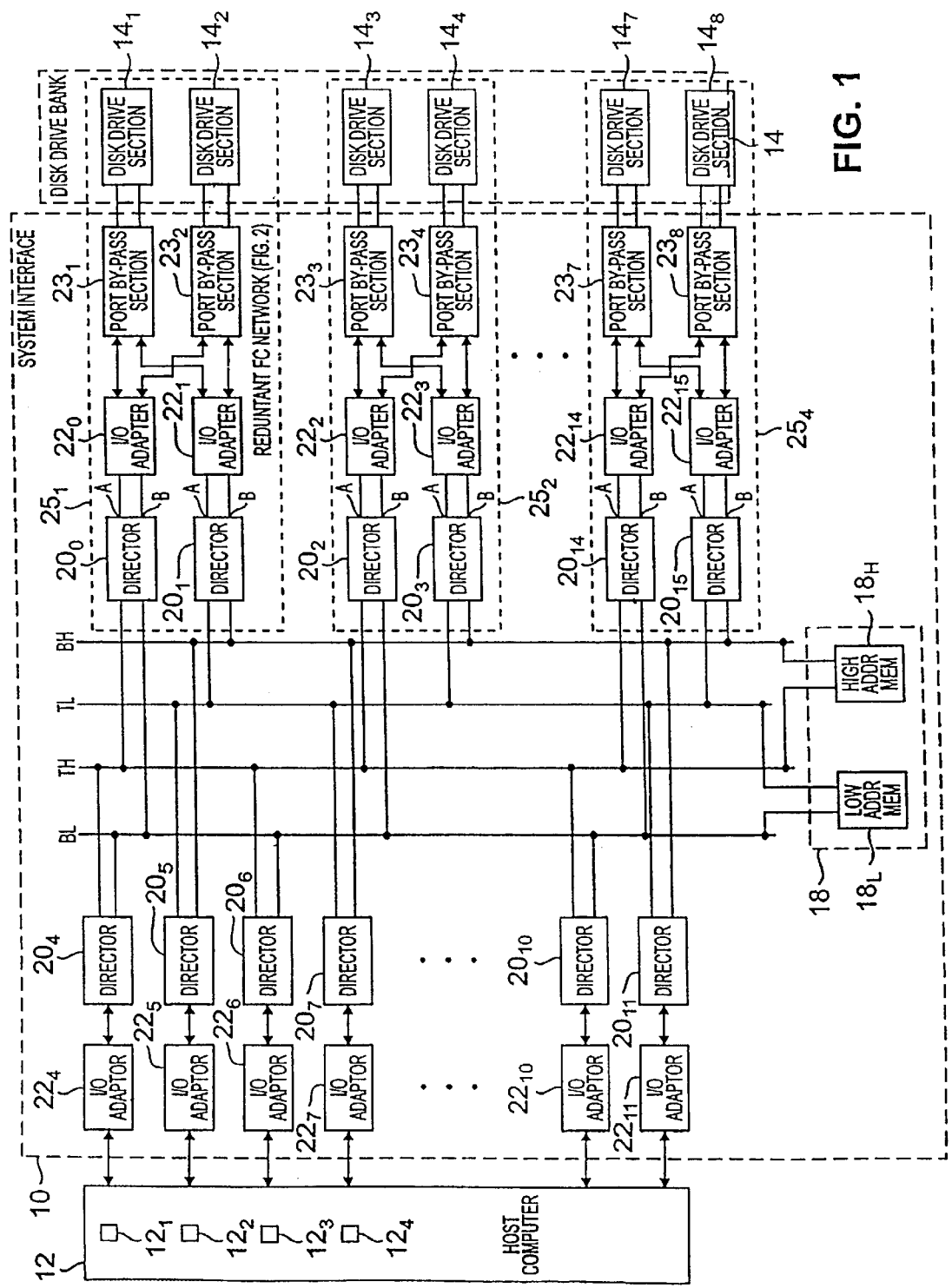
FIG. 1 is a block diagram of a data storage system according to the invention.

Referring now to FIG. 1, a data storage system 10 is shown wherein a host computer 12 is coupled to a bank 14 of disk drives through a system interface 16. The system interface 16 includes a cache memory 18, having a high memory address section 18H and a low address memory section 18L. A plurality of directors $20_0$–$20_{15}$ is provided for controlling data transfer between the host computer 12 and the bank 14 of disk drives as such data passes through the cache memory 18. A pair of high address busses TH, BH is electrically connected to the high address memory section 18H. A pair of low address busses TL, BL is electrically connected to the low address memory section 18L. The cache memory 18 has a plurality of storage location addresses. Here, the storage locations having the higher addresses are in the high address memory sections 18H and the storage locations having the lower addresses are in the low address memory sections 18L. It should be noted that each one of the directors $20_0$–$20_{15}$ is electrically connected to one of the pair of high address busses TH, BH and one of the pair of low address busses TL, BL. Thus, each one of the directors $20_0$–$20_{15}$ is able to address all locations in the entire cache memory 18 (i.e., to both the high address memory sections 18H and the low address memory sections 18L) and is therefore able to store data in and retrieve data from any storage location in the entire cache memory 18.

More particularly, a rear-end portion of the directors, here directors $20_0$–$20_3$ and $20_{12}$–$20_{15}$, is electrically connected to the bank 14 of disk drives through I/O adapter cards $22_0$–$22_3$ and $22_{12}$B$22_{15}$, respectively and fibre channel (FC) port by-pass sections $23_1$–$23_8$ (described in more detail in connection with FIG. 2), respectively. A front-end portion of the directors, here directors $20_4$–$20_{11}$, is electrically connected to the host computer 12 through I/O adapter cards $22_1$–$22_8$, respectively, as indicated. It should also be noted that each end of the busses TH, TL, BH, BL terminates in a pair of master and slave arbiters bus arbiters, not shown, as described in co-pending patent application Ser. No. 09/224, 194 filed Dec. 30, 1998, entitled DATA STORAGE SYSTEM, inventor Mark Zani, assigned to the same assignee as the present invention, the entire subject matter thereof being incorporated herein by reference.

In operation, when the host computer 12 wishes to store data, the host computer 12 issues a write request to one of the front-end directors $20_4$–$20_{11}$ to perform a write command. One of the front-end directors $20_4$–$20_{11}$ replies to the request and asks the host computer 12 for the data. After the request has passed to the requesting one of the front-end directors $20_4$–$20_{11}$, the director determines the size of the data and reserves space in the cache memory 18 to store the request. The front-end director then produces control signals on either a high address memory bus (TH or BH) or a low memory address bus (TL, BL) connected to such front-end director depending on the location in the cache memory 18 allocated to store the data and enable the transfer to the cache memory 18. The host computer 12 then transfers the data to the front-end director. The front-end director then advises the host computer 12 that the transfer is complete.

The front-end director looks up in a Table, not shown, stored in the cache memory 18 to determine which one of the rear-end directors $20_0$–$20_3$ and $20_{12}$–$20_{15}$ is to handle this request. The Table maps the host computer 12 address into an address in the bank 14 of disk drives. The front-end director then puts a notification in a "mail box" (not shown and stored in the cache memory 18) for the rear-end director which is to handle the request, the amount of the data and the disk address for the data. Other rear-end directors poll the cache memory 18 when they are idle to check their "mail boxes". If the polled "mail box" indicates a transfer is to be made, the rear-end director processes the request, addresses the disk drive in the bank, reads the data from the cache memory and writes it into the addresses of a disk drive in the bank 14. When data is to be read from the disk drive to the host computer 12 the system operates in a reciprocal manner.

Each one of the rear-end portion of the directors $20_0$–$20_3$ and $20_{12}$–$20_{15}$ is identical in construction and are described in detail in the above-referenced co-pending patent application Ser. No. 09/224,194 to include a pair of central processing sections, CPU X and CPU Y, a dual port random access memory (RAM), and shared resources (Flash memories, etc,) coupled to the bank 14 of disk drives (FIG. 1) through the I/O adapter cards $20_0$–$20_3$ and $20_{12}$–$20_{15}$ and the fibre channel (FC) port by-pass sections $23_1$–$23_8$ as indicated and to a high memory address bus, here TH, and low memory address bus, here BL. It should be noted that each one of the directors $20_0$–$20_3$ and $20_{12}$–$20_{15}$ has a first output port, A, and a second output port, B. Further, it should be noted that different pairs of the rear-end directors $20_0$, $20_1$; $20_2$, $20_3$; $20_{12}$, $20_{13}$ (not shown); and, $20_{14}$, $20_{15}$ are arranged in redundant fibre channel (FC) networks $25_1$–$25_4$, respectively, as indicated. Still further, it is noted that each one of the redundant fibre channel (FC) networks $25_1$–$25_4$ also includes: pairs of the I/O adapter cards $22_0$, $22_1$; $22_2$, $22_3$; $22_4$, $22_{12}$; $22_{13}$ (not shown); and $22_{14}$, $22_{15}$; fibre channel (FC) port by-pass sections $23_1$, $23_2$; $23_3$, $23_4$; $23_5$ (not shown), $23_6$ (not shown); and, $23_7$, $23_8$, respectively, as indicated and disk drive sets $14_1$, $14_2$; $14_3$, $14_4$; $14_5$ (not shown), $14_6$ (not shown); and, $14_7$, $14_8$, respectively, as indicated. Each one of the pairs of the redundant fibre channel (FC) networks $25_1$–$25_4$ is identical in construction, an exemplary one thereof, here redundant fibre channel (FC) networks $25_1$ is shown in detail in FIG. 2. As noted from FIG. 1, director $20_0$ is connected to busses TH and BL and that director $20_1$ is connected to busses TL and BH. Thus, the redundant FC network $25_1$ (FIG. 1) is also coupled, via directors $20_0$ and $20_1$ to all four busses TH, BH, TL, and BL.

Figure 2:
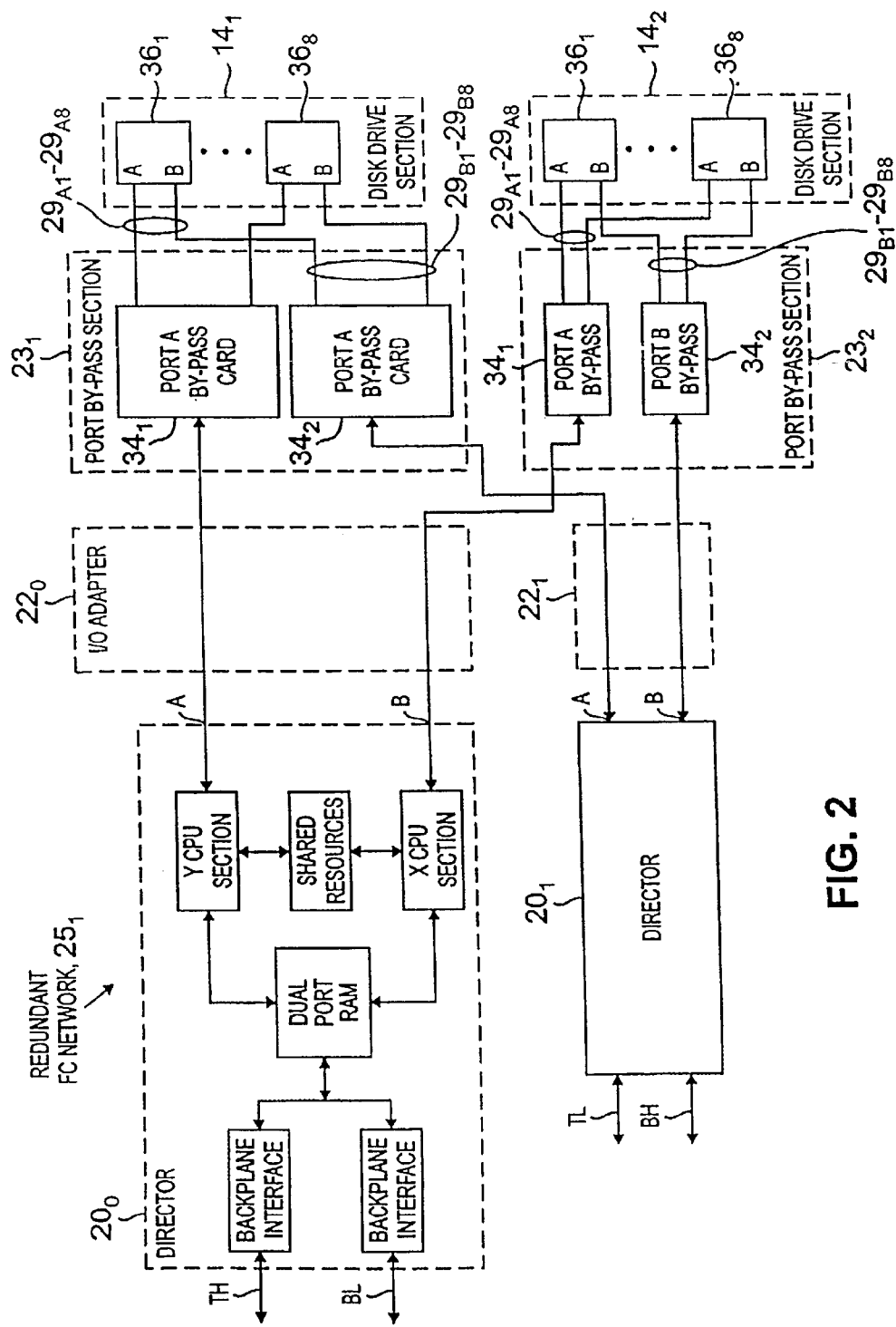
FIG. 2 is a block diagram of a redundant fibre channel network used in the system of FIG. 1 according to the invention.

Thus, as shown in FIG. 2 for an exemplary one of the redundant FC networks $25_1$–$25_4$, here redundant FC network $25_1$, it is noted that the first port A and second port B of director $20_0$ are connected, through I/O adapter $22_0$, to FC port by-pass section $23_1$ and to FC port by-pass section $23_2$, respectively. Likewise, the first port A and second port B of director $20_1$ are connected, through I/O adapter $22_1$, to FC port by-pass section $23_1$ and to FC port by-pass section $23_2$, respectively. Each one of the FC port by-pass sections $23_1$, $23_2$ includes a pair of FC port by-pass cards $34_1$ and $34_2$; here, an A port by-pass card $34_1$ and a B port by-pass card $34_2$. Each one of the disk drive sections $14_1$, $14_8$ (FIG. 1) includes a plurality of, here eight, disk drives, $36_1$–$36_8$, as indicated for disk drive sections $14_1$ and $14_2$ in FIG. 2, it being understood that the number of disk drives in a section can be selected in accordance with the requisite storage requirements.

Each one of the disk drives $36_1$–$36_8$ has a pair of redundant ports, i.e., a Port A and a Port B, as shown.

Figure 3:
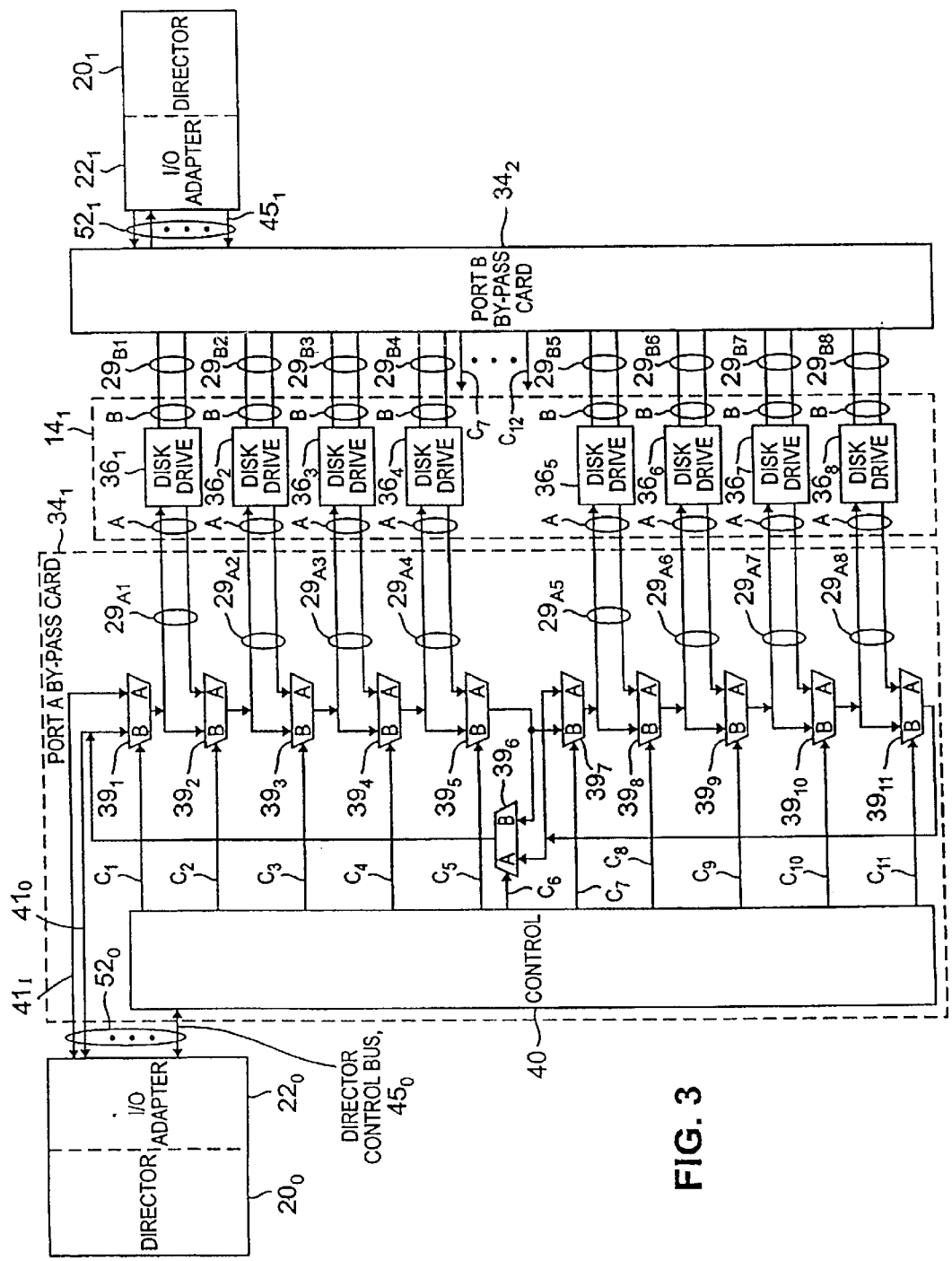
FIG. 3 is a block diagram of a port by-pass section used in the redundant fibre channel network of FIG. 3 coupled to a one of a plurality of disk drive sections in the bank of disk drives used in the system of FIG. 1 according to the invention.

Further, the A port by-pass card $34_1$, of each one of the port by-pass sections $23_1$, $23_2$ is connected to the A ports of the disk drives $36_1$–$36_8$ in a corresponding one of the disk drive sections $14_1$, $14_2$, respectively, as shown. Thus, the port A by-pass card $34_1$ of port by-pass section $23_1$ is connected to the A port of the disk drives $36_1$–$36_8$ in disk drive section $14_1$ and the port A by-pass card $34_1$ of port by-pass section $23_2$ is connected to the A port of the disk drives $36_1$–$36_8$ in disk drive section $14_2$, as shown. Likewise, the B port by-pass card $34_2$, of each one of the port by-pass sections $23_1$, $23_2$ is connected to the B ports of the disk drives $36_1$–$36_8$ in a corresponding one of the disk drive sections $14_1$, $14_2$, respectively, as shown. Thus, the port B by-pass card $34_2$ of port by-pass section $23_1$ is connected to the B port of the disk drives $36_1$–$36_8$ in disk drive section $14_1$ and the port B by-pass card $34_2$ of port by-pass section $23_2$ is connected to the B port of the disk drives $36_1$–$36_8$ in disk drive section $14_2$, as shown. Each one of the FC port by-pass cards $34_1$, $34_2$ and is identical in construction, an exemplary one thereof, here FC port by-pass $34_1$ being shown in detail in FIG. 3 connected between the A ports of the disk drives $36_1$–$36_8$ in the set $14_1$ of the disk drives and to the I/O adapters $20_0$-directors $20_0$. It is noted that the port B by-pass card $34_2$ of port by-pass section $23_1$ is also shown in FIG. 3 connected between the B ports of the disk drives $36_1$–$36_8$ in set $14_1$ of disk drives and the I/O adapter $22_1$-director $20_1$.

Referring to FIG. 2, it is noted, in the event of a failure in director $20_1$, director $20_0$ is able to access the disk drives $36_1$–$36_8$ in set $14_2$ through its port B and, likewise, in the event of a failure in director $20_0$ director $20_1$ is able to access disk drives $36_1$–$36_8$ in set $14_1$ through its A port. It is also noted that in the event of a failure of, or removal of, any one of the port A or port B by-pass cards $34_1$, $34_2$, both sets of disk drives $14_1$ and $14_2$ are still accessible from one of the directors $20_0$ and $20_1$. For example, if the port A by-pass $34_1$ of fibre channel port by-pass section $23_1$ fails or is removed, the set $14_1$ of disk drives is accessible from director $20_1$, via the path between port A of director $20_0$, the port B by-pass card $34_2$ of fibre channel by-pass section $23_1$, and the port B of the disk drives in set $14_1$. In like manner, if the port B by-pass $34_2$ card of fibre channel port by-pass section $23_1$ fails or is removed, the set $14_1$ of disk drives is accessible from director $20_0$, via the path between port A of director $20_0$, the port A by-pass $34_1$ of fibre channel by-pass section $23_1$, and the port A of the disk drives in set $14_1$. If the port A by-pass card $34_1$ of fibre channel port by-pass section $23_2$ fails or is removed, the set $14_2$ of disk drives is accessible from director $20_1$, via the path between port B of director $20_1$, the port B by-pass card $34_2$ of fibre channel by-pass section $23_2$, and the port B of the disk drives in set $14_2$. In like manner, if the port B by-pass 342 of fibre channel port by-pass section $23_2$ fails or is removed, the set $14_2$ of disk drives is accessible from director $20_0$, via the path between port B of director $20_0$, the port A by-pass $34_1$ of fibre channel by-pass section $23_2$, and the port A of the disk drives in set $14_2$.

Port A by-pass card $34_1$ and port B by-pass card $34_2$ are the same in structure. Port A by-pass selector, or multiplexer, card $34_1$ is adapted to couple the port A of director $20_0$ (via I/O adapter $22_0$) serially to a selected one, or ones, of port A of the plurality of disk drives $36_1$–$36_8$ in set $14_1$ through a first fibre channel comprising one, or more, of the plurality of fibre channel links $29_{A1}$–$29_{A8}$, and the fibre channel port by-pass multiplexer card $34_2$ is adapted to couple the A port of director $20_1$ (via the I/O adapter $22_1$) serially to a selected one, or ones, of the plurality of disk drives $36_1$–$36_8$ through fibre channel links $29_{B1}$–$29_{B8}$, as indicated, in a manner to be described briefly below and described in detail in copending patent application Ser. No. 09/343,344, filed Jun. 30, 1999.

PORT BY-PASS CARD

Referring to FIG. 3, the exemplary FC port by-pass card $34_1$ includes multiplexers $39_1$–$39_{11}$ and a control section 40. (It should be understood that the number of multiplexers is determined in accordance with the requisite storage requirements). Each one of the multiplexers $39_1$–$39_{11}$ has a pair of input ports (i.e., an A input and a B input) and an output port, one of the input ports A or B being coupled to the output port selectively in accordance with a control signal $C_1$–$C_{11}$, respectively, fed thereto, as indicated, by the control section 40. The operation of the control section 40 is described in detail in the above referenced copending patent application Ser. No. 09/343,344 filed Jun. 30, 1999 assigned to the same assignee as the present invention, the entire subject matter thereof being incorporated herein by reference. The normal operating mode, as well as other modes of operation, is described fully in the above-referenced patent application Ser. No. 09/343,344. For convenience, the normal operating mode will be described below, it being understood that the port B by-pass card $34_2$ is structurally the same as the port A by-pass card $34_1$.

NORMAL OPERATING MODE

During the normal operating mode, port A of director $20_0$ is coupled serially through disk drives $36_1$–$36_4$ of set $14_1$ via ports A of such disk drives $36_1$–$36_4$ and port B of director $20_1$ is coupled serially through disk drives $36_5$–$36_8$ of set $14_1$ via ports B of such disk drives $36_5$–$36_8$. Such is accomplished by the control signals $C_1$–$C_{11}$ from director $20_0$ on bus $45_0$ equivalent control signals from director $20_1$ on bus $45_1$ to port B by-pass card $34_2$ which couple one of the A and B ports of the multiplexers coupled to the outputs of such multiplexers as described fully in the above referenced patent application Ser. No. 09/343,344.

For example, considering port A by-pass card $34_1$ during normal operation, the A inputs of multiplexers $39_1$–$39_6$ are coupled to their outputs while the B inputs of multiplexers $39_7$–$39_{11}$ are coupled to their outputs. Thus, during normal operation, the data from director $20_0$ I/O adapter $22_0$ on fiber channel transmission line $41_1$ passes sequentially through multiplexer $39_1$, to the A port of disk drive $36_1$, through multiplexer $39_2$ to the A port of disk drive $36_2$, through multiplexer $39_3$, to the A port of disk drive $36_3$, through multiplexer $39_4$ to the A port of disk drive $36_4$, and then sequentially through multiplexer $36_5$, multiplexer $36_7$ multiplexer $36_8$, multiplexer $36_{92}$ multiplexer $36_{10}$ multiplexer $36_{11}$, multiplexer $36_6$ to fibre channel transmission line $41_1$ to I/O adapter $22_0$-director $20_0$. Port B by-pass card $34_2$ operates, as noted above to couple the A port of director $20_1$-I/O adapter $22_1$ to the B ports of disk drives $36_5$–$36_8$ in response to the control section therein.

In the event of a failure in one of the disk drives $36_1$–$36_8$, the control sections 40 are advised of such failure by the directors $20_0$ and $20_1$ via control lines $45_0$, $45_1$, respectively. For example, assume there is a failure in disk drive $36_3$. Once such a failure is detected during the normal operating mode, control section 40 changes the logic state on control line $C_4$ to thereby de-couple input port A of multiplexer $36_4$ from its output and couples input port B of multiplexer $36_4$ to its output; thereby by-passing disk drive $36_3$ from the fibre channel transmission line segments $41_1$, $41_0$. In like manner, if there is a failure in disk drive $36_7$, once such a failure is detected during the normal operating mode, control section 40 (not shown) in port B by-pass card $34_2$ changes the logic state on a control line therein to thereby de-couple disk drive $36_7$ from the I/O adapter $22_1$-director $20_1$.

FAILURE OF ONE OF THE DIRECTORS $20_0$ or $20_1$

As noted above, during normal operation, director $20_0$ is coupled to the A ports of disk drives $36_1$–$36_4$ and director $20_1$ is coupled to the B ports of disk drives $36_5$–$36_8$. In the event of a failure in director $20_0$, director $20_0$ is de-coupled from disk drives $36_1$–$36_4$ and director $20_1$ is coupled to the B ports of disk drives $36_1$–$36_4$ in addition to remaining coupled to the B ports of disk drives $36_6$–$36_8$. Likewise, in the event of a failure in director $20_1$, director $20_1$ is de-coupled from disk drives $36_5$–$36_8$ and director $20_0$ is coupled to the A ports of disk drives $36_5$–$36_8$ in addition to remaining coupled to the A ports of disk drives $36_1$–$36_4$. Such is accomplished (i.e., removal of failed director $20_1$, for example) by the control signals which couple one of the A and B ports of the multiplexers coupled to the outputs of such multiplexers as described fully in the above-referenced patent application Ser. No. 09/343,344.

SYSTEM BACKPLANE AND DISK BACKPLANE INTERCONNECTION

Figure 4:
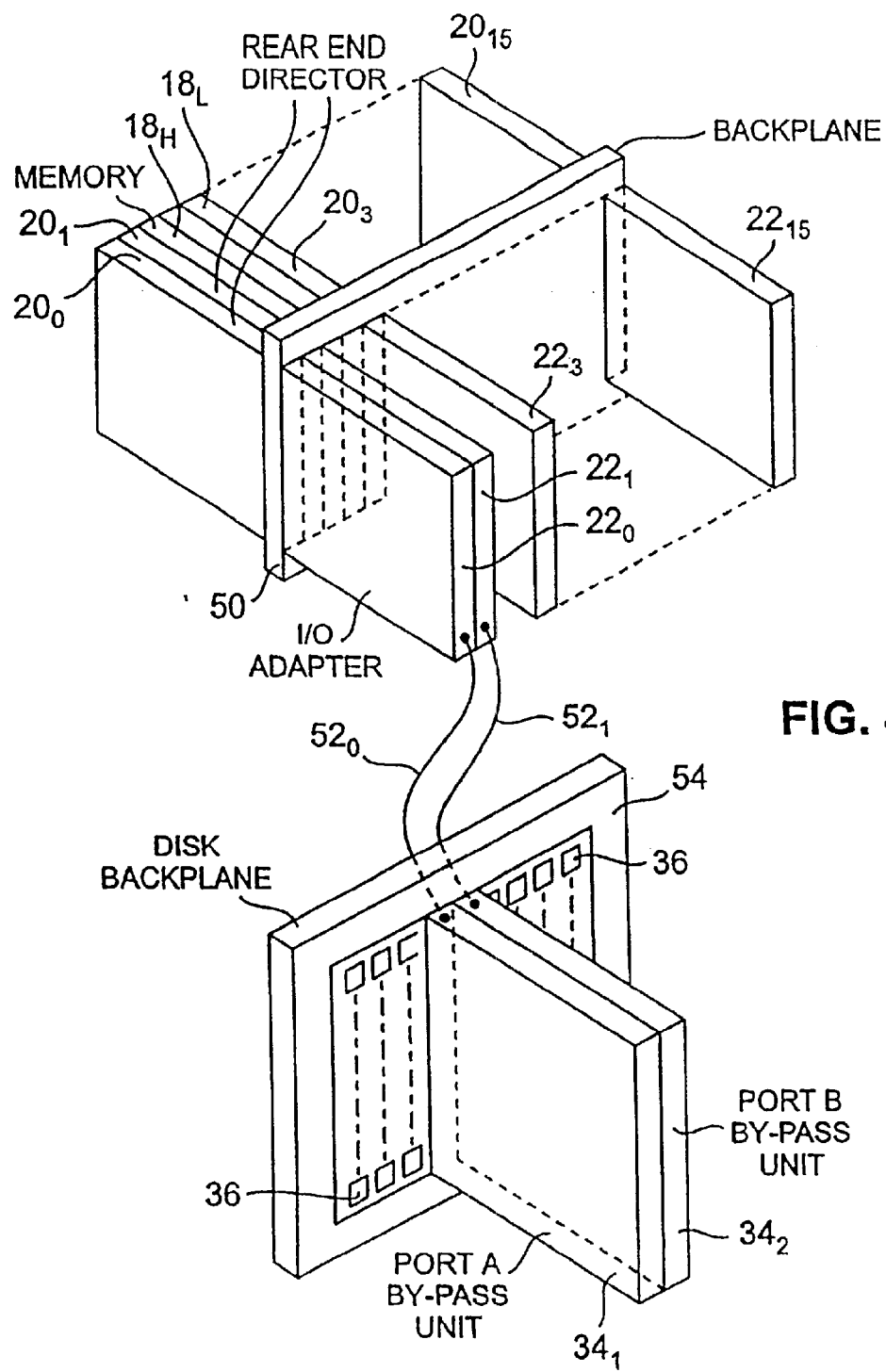
FIG. 4 is a sketch showing the interconnection input/ output (I/O) adapters used in the system of FIG. 1 to disk drives and a pair of port-by pass cards used in the redundant fibre channel network of FIG. 2.

Referring now to FIGS. 1 and 4, the I/O adapters $22_0$–$22_{15}$ are shown plugged into the front side of a system backplane 50 and the directors $22_0$–$22_{15}$ and high and low memories 18H, 18L are plugged into rear side of the system backplane 50. The arrangement is shown, and described, in more detail in the above referenced copending patent application Ser. No. 09/224,194. The I/O adapters $22_0$–$22_3$ and $22_{12}$–$22_{15}$ are connected to the port A by-pass card $34_1$ and port B by-pass cards $34_2$ of the port by-pass sections $23_1$ through $23_8$ as discussed above in connection with FIG. 2. Further, as noted above, the port by-pass section $23_1$ through $23_8$ are arranged in pairs, each pair being a corresponding one of the redundant fibre channel networks $25_1$–$25_4$. Thus, considering an exemplary one of the redundant fibre channel networks $25_1$–$25_4$, here redundant fibre channel networks $25_1$, and referring to FIG. 4, it is noted that the I/O adapters $22_0$, $22_1$ of such redundant fibre channel network $25_1$ is connected to the rear side of a disk backplane printed circuit board 54 through cables $52_0$, $52_1$, respectively. These cables $52_0$, $52_1$ will be described in detail in connection with FIG. 5. Suffice it to say here, however, that each one of the cables $52_0$, $52_1$ is adapted to carry both fibre channel signals and non-fibre channel signals.

Figure 6:
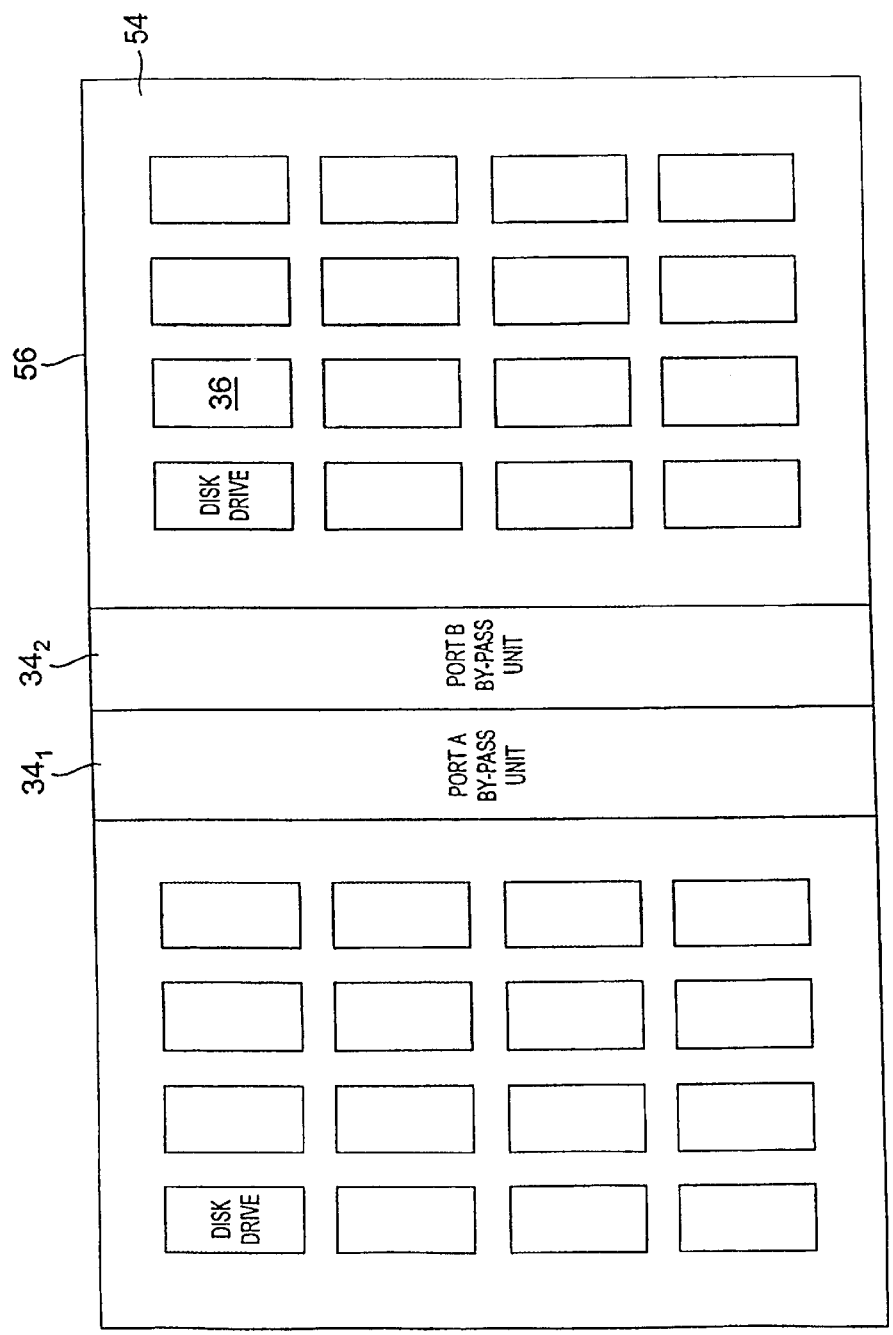
FIG. 6 is a diagrammatical sketch of an elevation view of a disk backplane having plugged therein the disk drives and the pair of port-by pass cards of FIG. 4.
Figure 7:
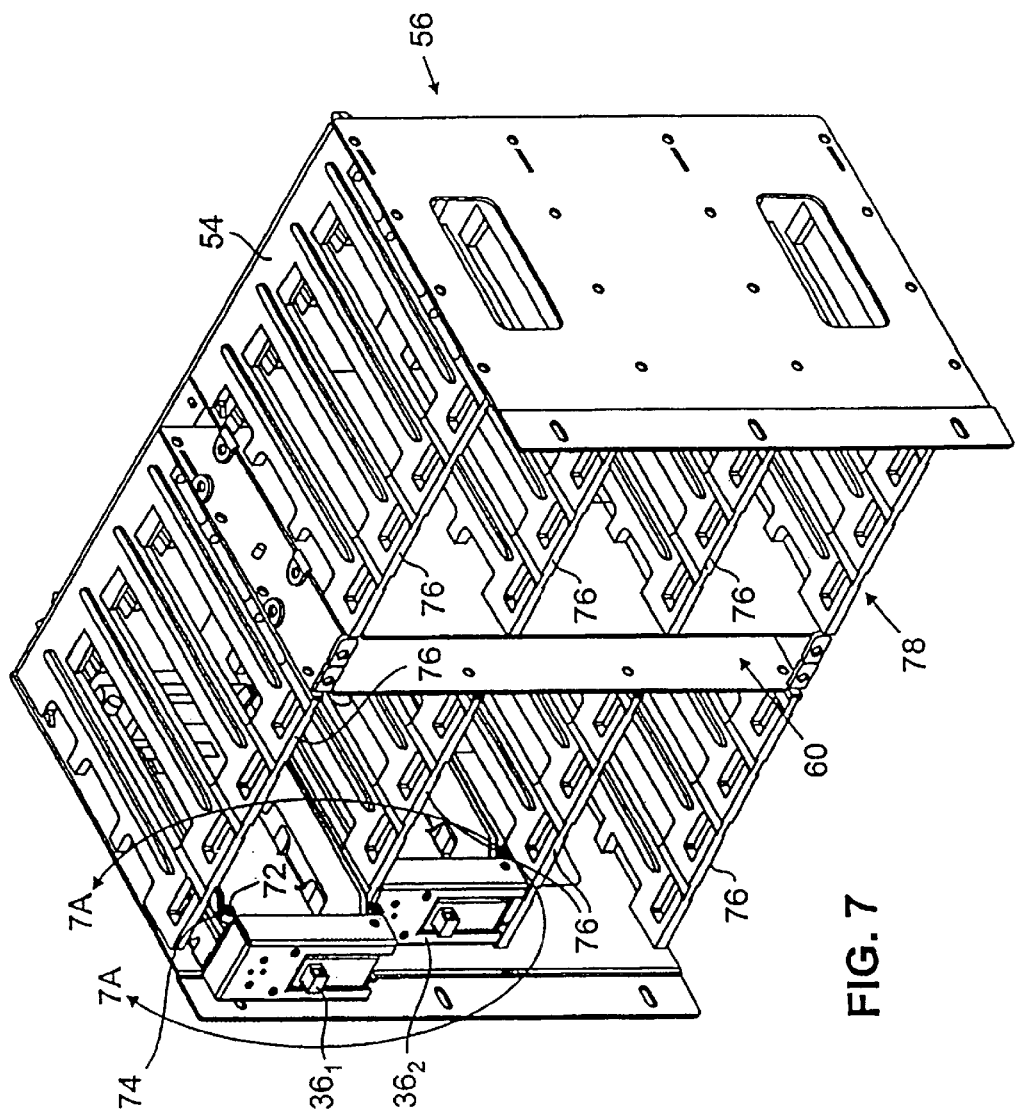
FIG. 7 is an isometric view of a cabinet used to store the disk backplane having plugged therein the disk drives and the pair of port-by pass cards of FIG. 4.
Figure 8:
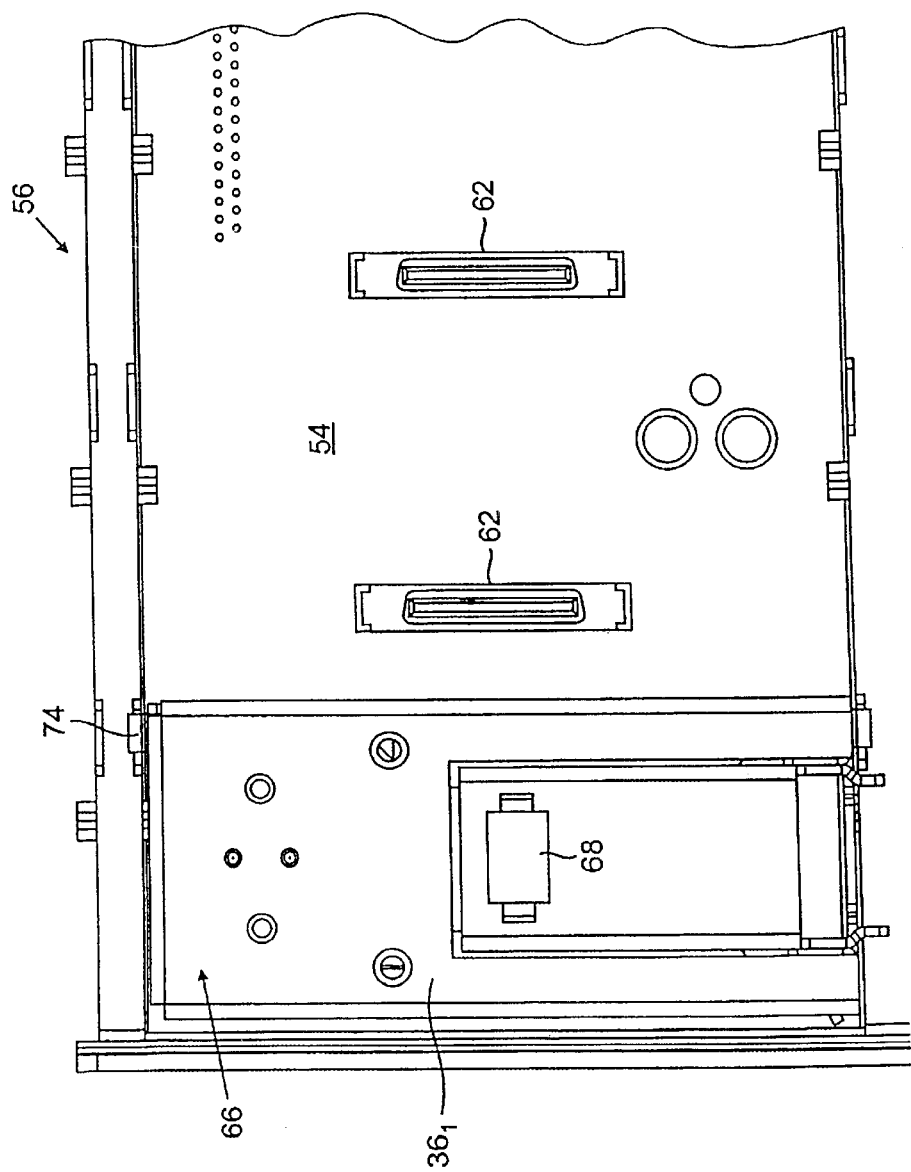
FIG. 8 is a plan view of a portion of the disk backplane of FIG. 6, such disk backplane having a disk drive plugged into one of a plurality of connectors of such disk backplane.

Plugged into the front side of the disk backplane 54 are the port A by-pass card $34_1$ and the port B by-pass card 342 of the redundant fibre channel network $25_1$. The backside of the disk backplane 54 has slots 36 for receiving the disk drives $36_1$–$36_8$, as shown in FIG. 6. A rack 56, shown in FIG. 7 stores the disk drives $36_1$–$36_8$, the disk backplane 54 and the port A and port B by-pass cards $23_1$ and $23_2$. FIG. 7 shows only two disk drives $36_1$ and $36_2$, disk drive $36_2$ being shown in a fully inserted position and disk drive $36_1$ being shown in a partially inserted position. The rack 56 shown in FIGS. 6 and 7 is configured with twenty-four disk drive slots 36 and a slot 60 for receiving two port by-cards $36_1$ and $36_2$. The disk backplane 54 is mounted to the rear of the rack 54, as shown. The disk backplane 54 has eight electrical connectors 62 (FIG. 8) each in registration with a corresponding one of the slots 36. The connectors are thus arranged to enable the disk drives $36_1$ to here $36_8$ to be plugged into the electrical connectors 62, it being understood that while here eight disk drives $36_1$ to $36_8$ have been used for illustration, the system is here adapted for use with up to twenty four disk drives. The disk drives are electrically interconnected through conductors, not shown, in the disk backplane 54.

Figure 9:
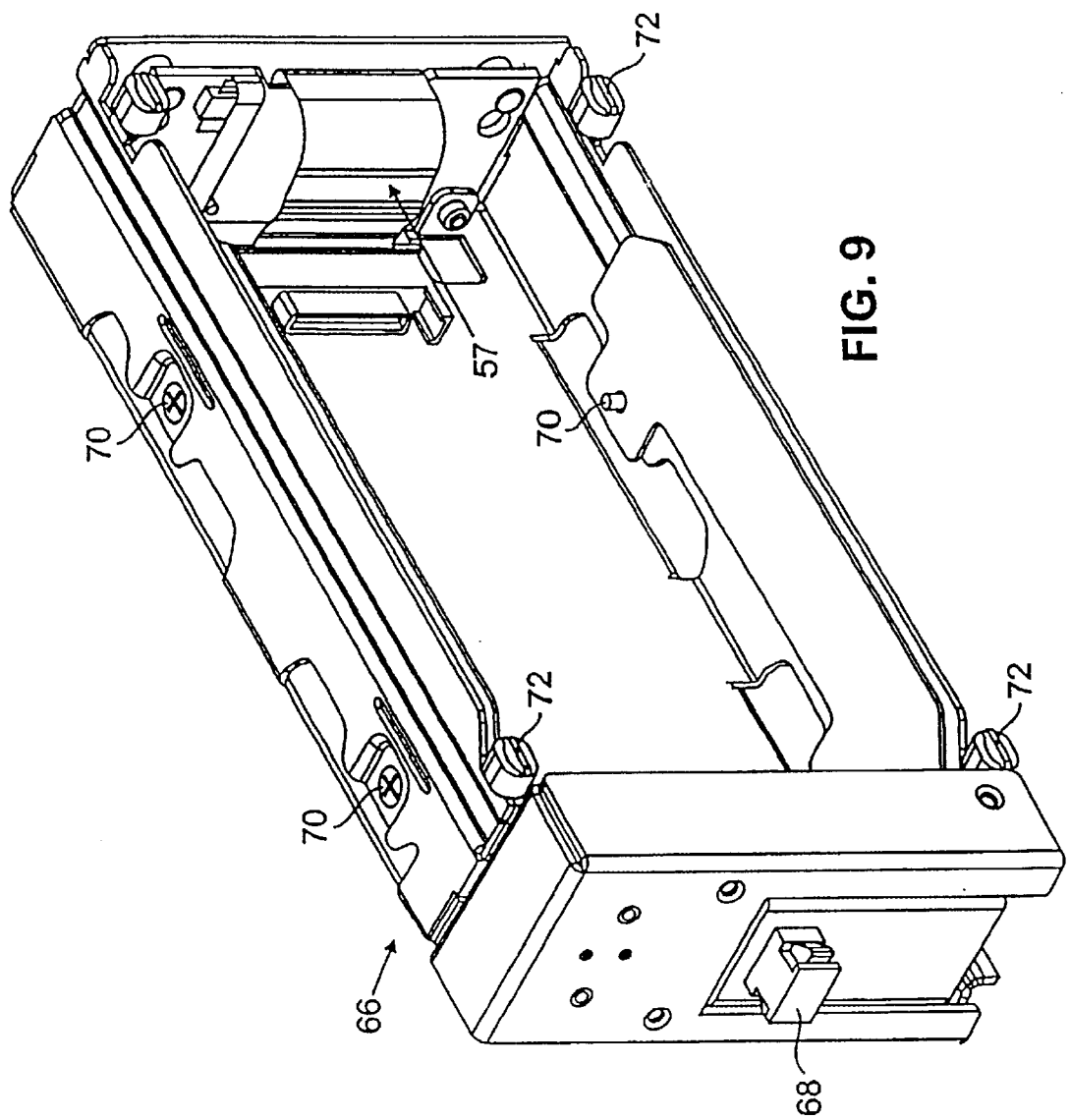
FIG. 9 is an isometric view of housing, or chassis, used for an exemplary one of the disk drives adapted for being plugged into the connector of the disk backplane of FIG. 8.
Figure 10:
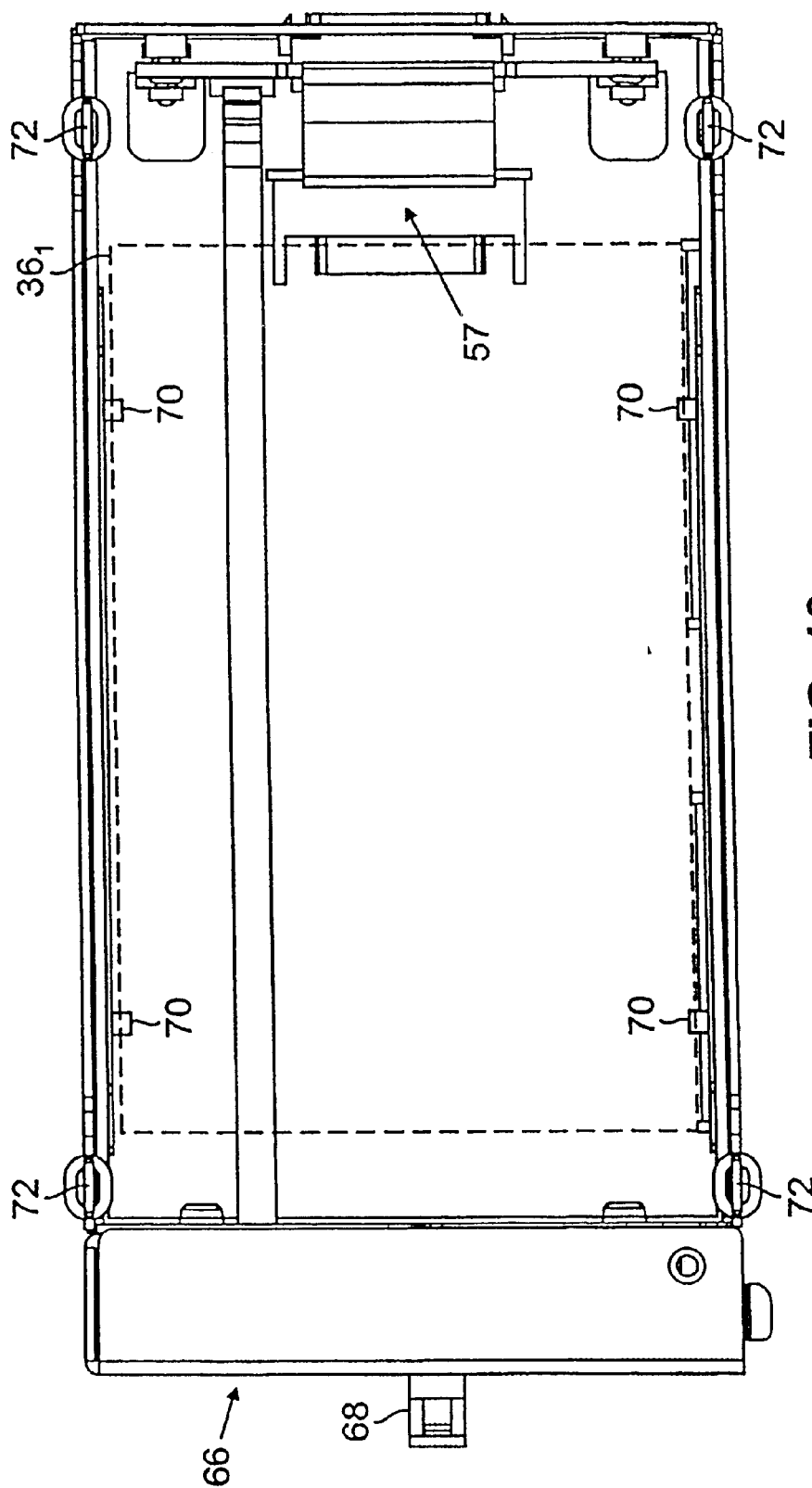
FIG. 10 is a top view of the housing of FIG. 9, a disk drive being shown in phantom in the chassis.
Figure 11:
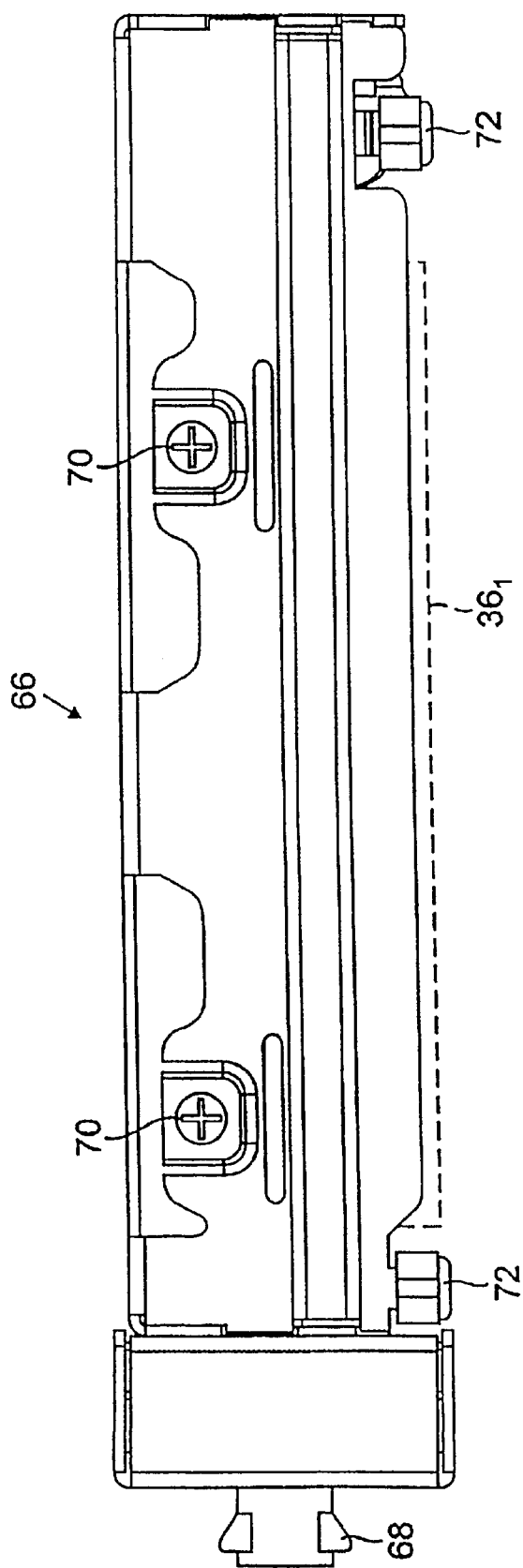
FIG. 11 is a side view of the housing of FIG. 9, is an enlarged view of the rear portion of the FIG. 10.

Referring to FIGS. 9–11, an exemplary one of the housings 66 for disk drive $36_1$, the disk drive being shown in phantom in FIGS. 10 and 11, FIG. 9 showing the housing 66 without the disk drive. The disk drive chassis has a lock-handle 68 on the front panel thereof and screws 70 mounted on the opposing sides thereof for engagement with the sides of the disk drive, in a conventional manner. Here, however, the disk drive housing 66 includes features according to the invention which reduce vibration occurring in the disk drive, from coupling to the rack 56 and thereby coupling through the rack 56 to the other disk drives in the rack 56. It has been found that when there are many disk drives in the rack 56, during operation of the disk drives, the vibration through the rack 56 can cause excessive vibration on the disk drives resulting in their malfunction.

Figure 7A:
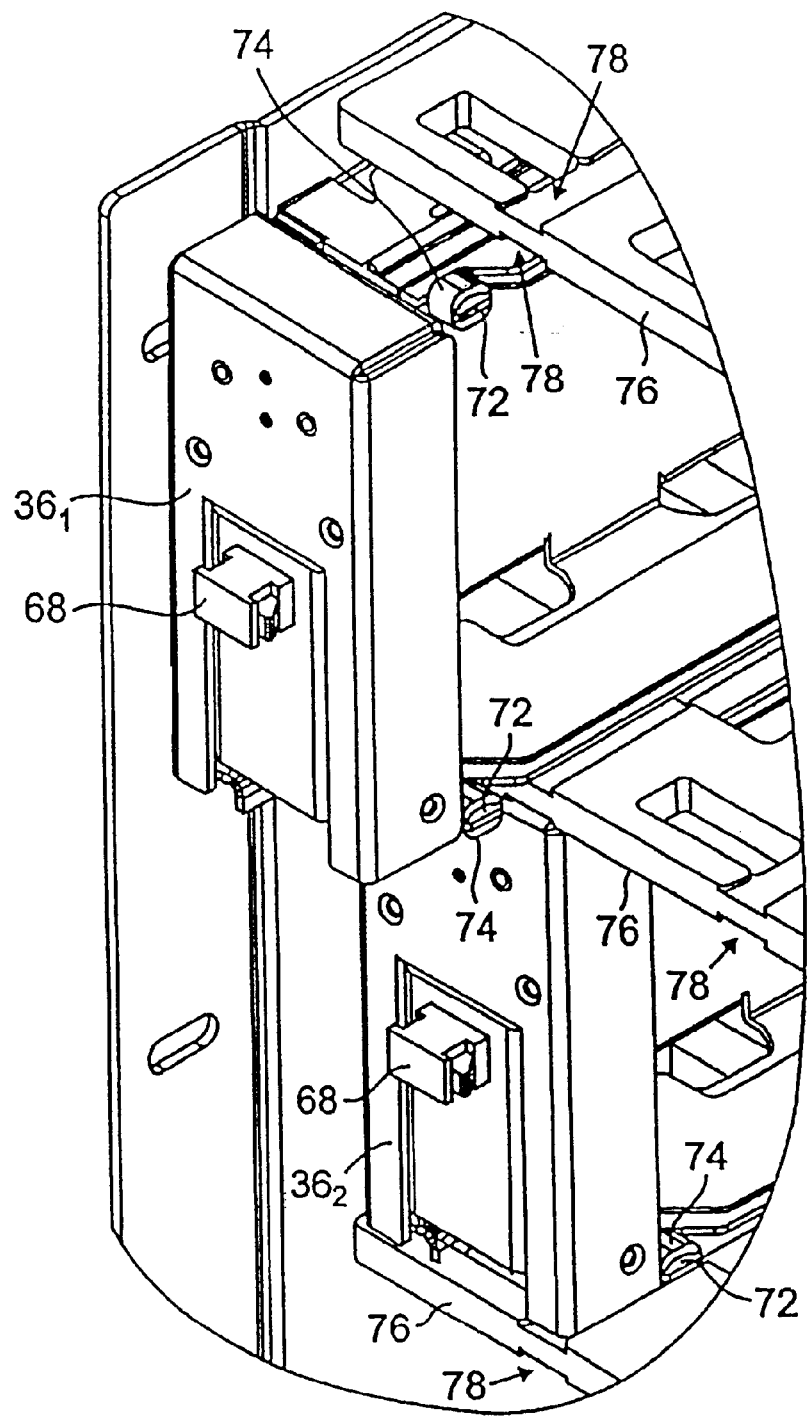
FIG. 7A is an exploded view of a portion of the cabinet of FIG. 7, such portion being enclosed by arrow 7A—7A in FIG. 7.

According to the invention, two features are used to reduce the coupling of vibration in the disk drive into the rack 56. The first is to use a resilient material, e.g., rubber-like material 74, on the housing 66 which engages the rack 56. Here, the housing 66 is formed with a plurality of, here four, legs 72, each of which has the resilient material 74 disposed around it, as shown. As noted most clearly in FIG. 8 for partially inserted disk drive $36_1$, portions of the resilient material 74 project beyond the sides of the housing 66. It is noted that the rack 56 (FIGS. 7 and 7A). has a plurality of horizontal members 76. Upper and lower pairs of the horizontal members 76 have vertically opposing pairs of slots 78 therein. Each opposing pair of slots 78 is configured to engage the upper pair and lower pair of legs 72 with the resilient material 74 around such legs 72. This is more clearly illustrated in FIG. 7A. When the housing 66 is inserted fully in the rack 66, the resilient member presses firmly against the walls of the slots 78 to thereby cushion, and thus suppress, any vibrations produced during operation of the disk drive which may coupled to its housing 66 from coupling to the rack 56. That is, the vibrations coupled to the housing are dampened by the resilient, shock absorbing material 74 around the legs 72 and such vibrations are thereby decoupled from the rack 56.

Figure 12:
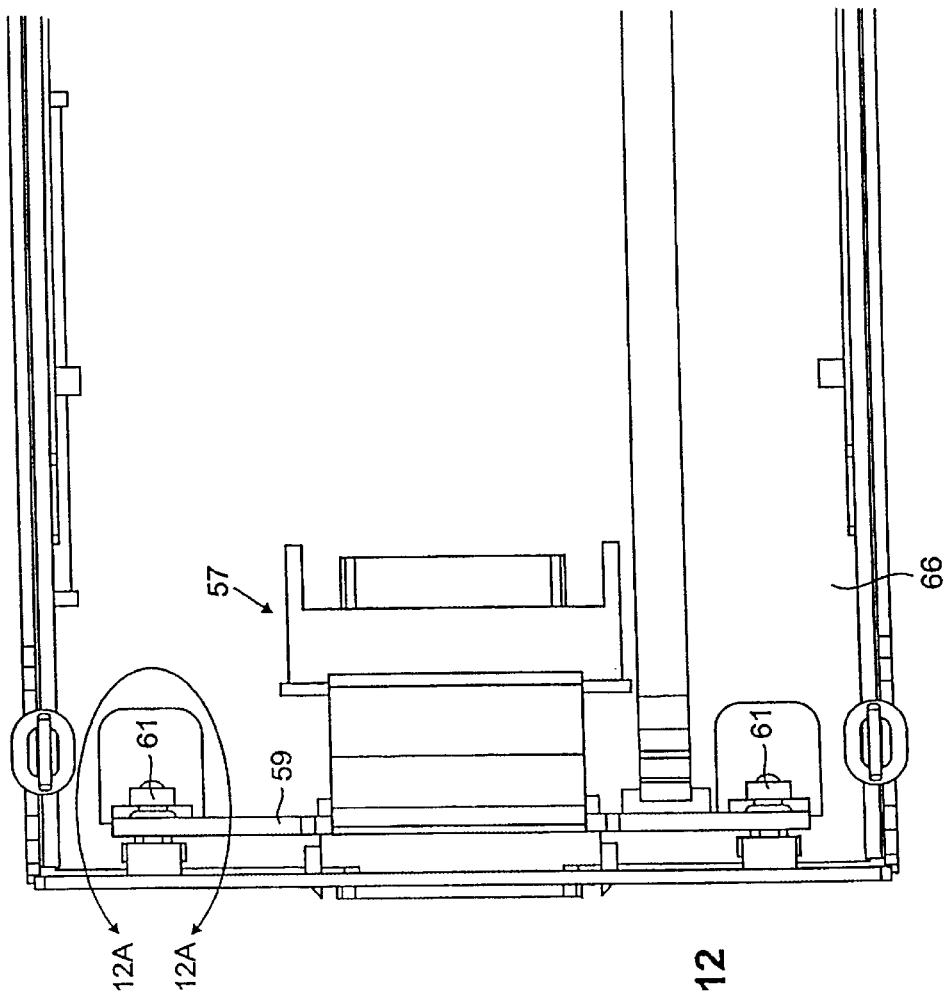
FIG. 12 is an enlarged view of the rear portion of the FIG. 10.
Figure 13:
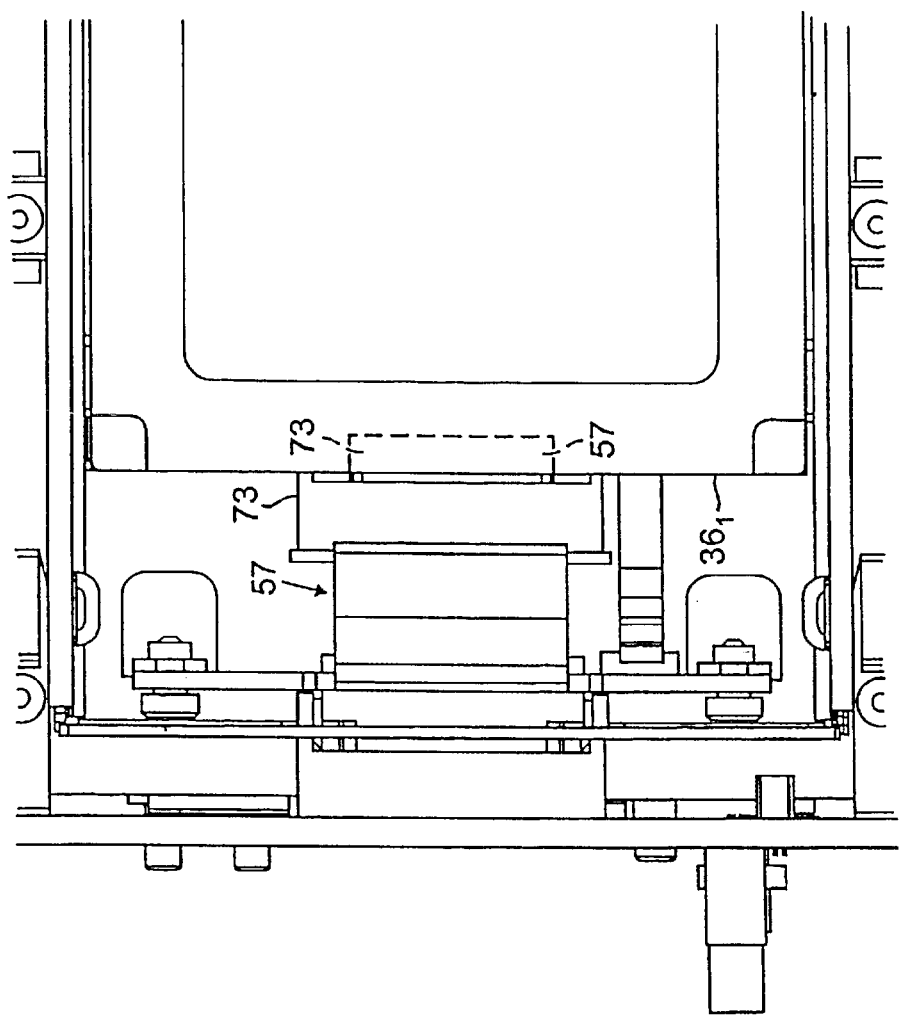
FIG. 13 is an enlarged view of the rear portion of the FIG. 10, and a disk drive being shown plugged into a cable of the chassis of FIG. 12.
Figure 12A:
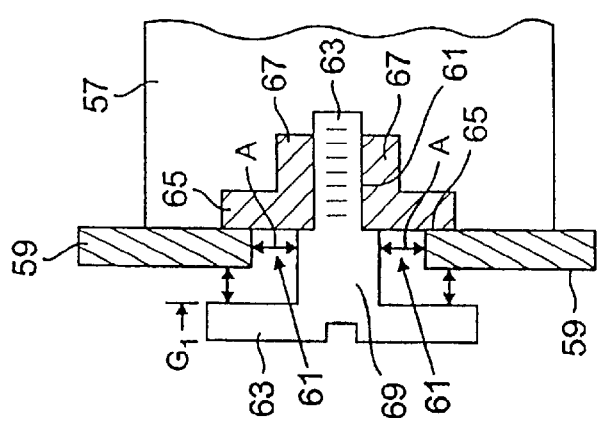
FIG. 12A is a cross-sectional sketch of a portion of the chassis of FIG. 12, such portion being enclosed with an arrow 12A—12A in FIG. 12.

A second technique used to decouple vibration produced during operation of the disk drive from the rack 56 is through the electrical interconnect arrangement used to connect the disk drive to the connector 62 (FIG. 8) on the disk backplane 54. More particularly, and referring also to FIG. 9, a flexible ribbon-type, or strap-type, electrical connector 57 (FIGS. 9,12, and 13) having a mounting member 59 (FIGS. 12 and 12A) attached thereto to the rear of the ribbon-type connector 77 is used. The mounting member 59 has oval-shaped holes 61 (FIG. 12A) for receiving mounting screws 63. The rear of the housing 66 is provided with a mounting plate 65. The mounting plate 65 has a pair of screw receiving fixtures 67 attached thereto for receiving the mounting screws 63 after the holes 61 are aligned with fixtures 67. The screws 63 have a shoulder 69 which spaces the head of the screw 63 from the mounting member 59 when the screw is tightly threaded into the fixture 67. The shoulder 69 thus causes a $gapG_1$ between the mounting member and the head of the screw 63. Further, the oval-shaped hole 61 allows for lateral back-and-forth movement of the screw 63 in the hole 61 even after the screw is threaded into the fixture 67, such back-and-forth movement being indicated by the arrows A in FIG. 12A.

The arrangement is designed such that when the mounting member 59 is screwed to the mounting plate 65 with the screws 63, the mounting member 59 is prevented from being rigidly secured to the mounting plate 65. This is accomplished by constructing the screws 63 so that when fully inserted into their mating threaded holes, the shoulder 69 and oval-shaped holes 61 Referring to FIG. 13, the plug 71 of the flexible ribbon-type, or strap-type, electrical connector 57 is shown engaged with the plug 73 at the rear of the disk drive $36_1$. With such an arrangement as vibrations in the drive couple to the chassis and thus to the ribbon mounting member, such vibration will not could to the mounting plate because the two are not rigidly attached one to the other because of the mechanism described above.

SYSTEM BACKPLANE TO DISK DRIVE BACKPLANE CABLE

Figure 5:
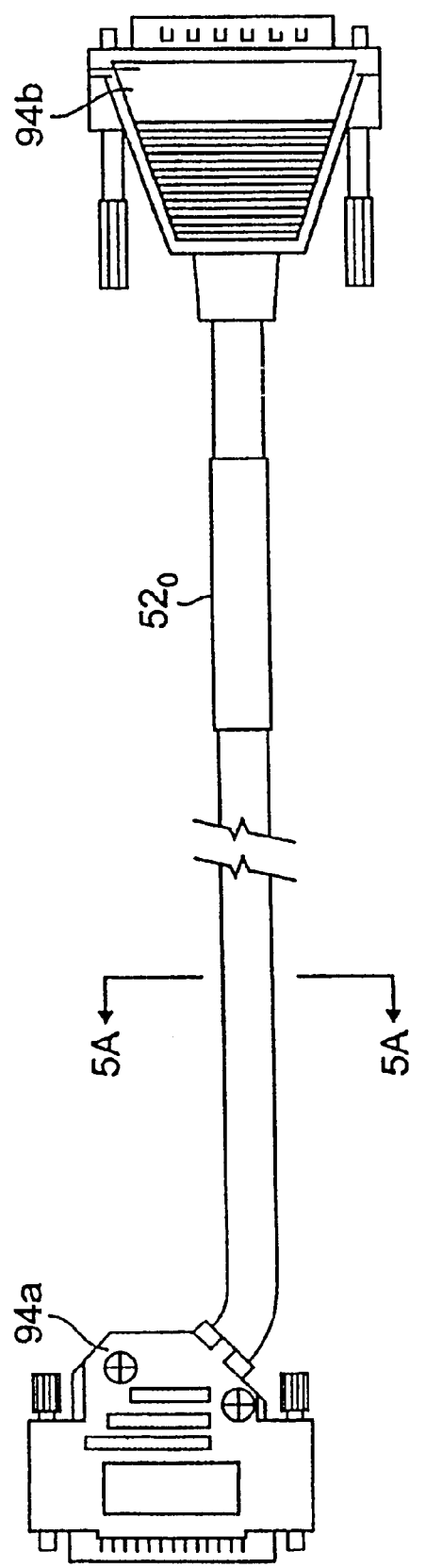
FIG. 5 is a diagram of a cable adapted to transmit both fibre channel signals and non-fibre channel signals.
Figure 5A:
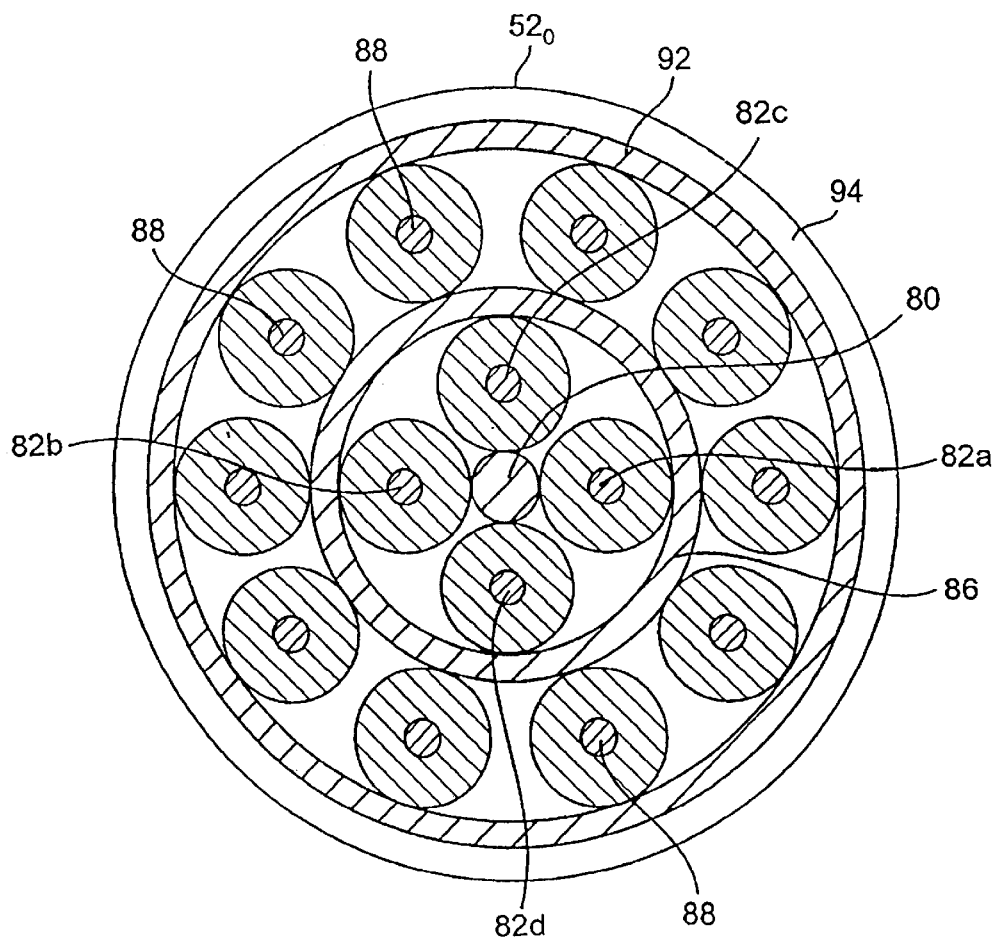
FIG. 5A is a cross-sectional sketch of the cable of FIG. 5, such cross-section being taken along line 5A—5A in FIG. 5.
Figure 5B:
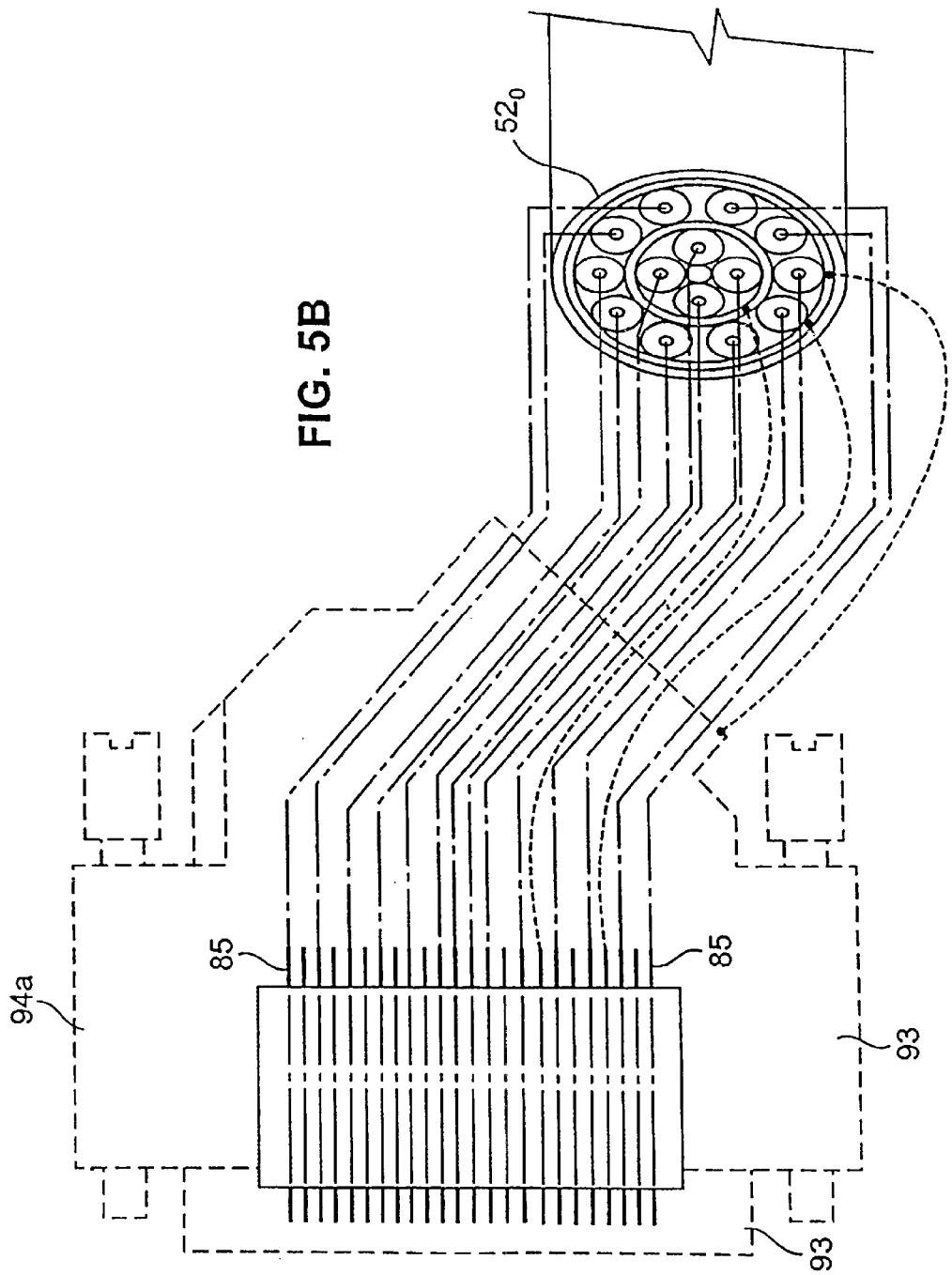
FIG. 5B is a diagrammatical sketch showing connections between conductors in the cable of FIG. 5 to pins in one of a pair of connectors of such cable.

Referring now to FIGS. 5, 5A and 5B, an exemplary one of the cables $52_0$, $51_1$, connecting the I/O adapters $22_0$–$22_3$ and $22_{12}$–$22_{15}$, here cable $52_0$, is shown. As noted above, the exemplary cable $52_0$ is adapted to carry both fibre channel signals and non-fibre channel signals. The fibre channel signals include the data for storage in the disk drives and the non-fibre channel signals include the control signals described above for controlling the multiplexers in the port by-pass cards as well as other control signals for controlling the operation of the disk drives. It is noted that both the fibre channel signals and the non-fibre channel signals pass through the same cable. Thus, a single connector is used at each end of the cable for both the fibre channel signals and the non-fibre channel signals.

More particularly, and referring also to FIG. 5A, the cable $52_0$ is shown to have a central dielectric core 80. The core has around it the conventional quadrature-pair of electrically insulated conductors 82a–82d arranged for transmission of two pair of differential fibre channel signals. One pair of signals (i.e., the signals of conductors 82a and 82b are the data from the I/O adapter to the port by-pass card, e.g., the data on $41_1$ in FIG. 3) and the other pair of signals (i.e., the signals of conductors 82c and 82d are the data from the port by-pass card to the I/O adapter, e.g., the data on $41_0$ in FIG. 3). Disposed around the quadrature-pair of electrically insulated conductors 82a–82d is an inner conductive shield 86. Disposed around the inner conductive shield 86 are a plurality, here ten regularly spaced electrically insulated electrical conductors 88 which carry the non-fibre channel signals. e.g., for control signals. Disposed round the electrically insulated conductors 88 is an outer conductive shield 92. Disposed around the outer conductive shield 92 is a rubber-like sheath 94.

The ends of the conductors 82a–82d and the ends of the ten conductors 86 are connected to lugs, or pins 85, at each of a pair of plugs 94a, 94b, as shown more clearly in FIG. 5B for plug 94a. Also the inner conductive shield 86 is connected to one of the lugs and the outer conductive shield 92 is connected to the conductive outer housing 93 of the plugs 94a, 94b. It is noted that each of the plugs is here a conventional 25-pin plug, thus here not all of the 25 pins are used.

Thus, the fibre channel data passes through an inner, electro-statically shielded region of the transmission media provided by the cable and the control signals pass through an outer, electro-statically shielded region of the transmission media provided by the cable. Further is noted that only one plug is required at each end of the cable transmission of both the fiber channel signals and the non-fibre channel signals.

FAIL-OVER MODE

Figure 14:
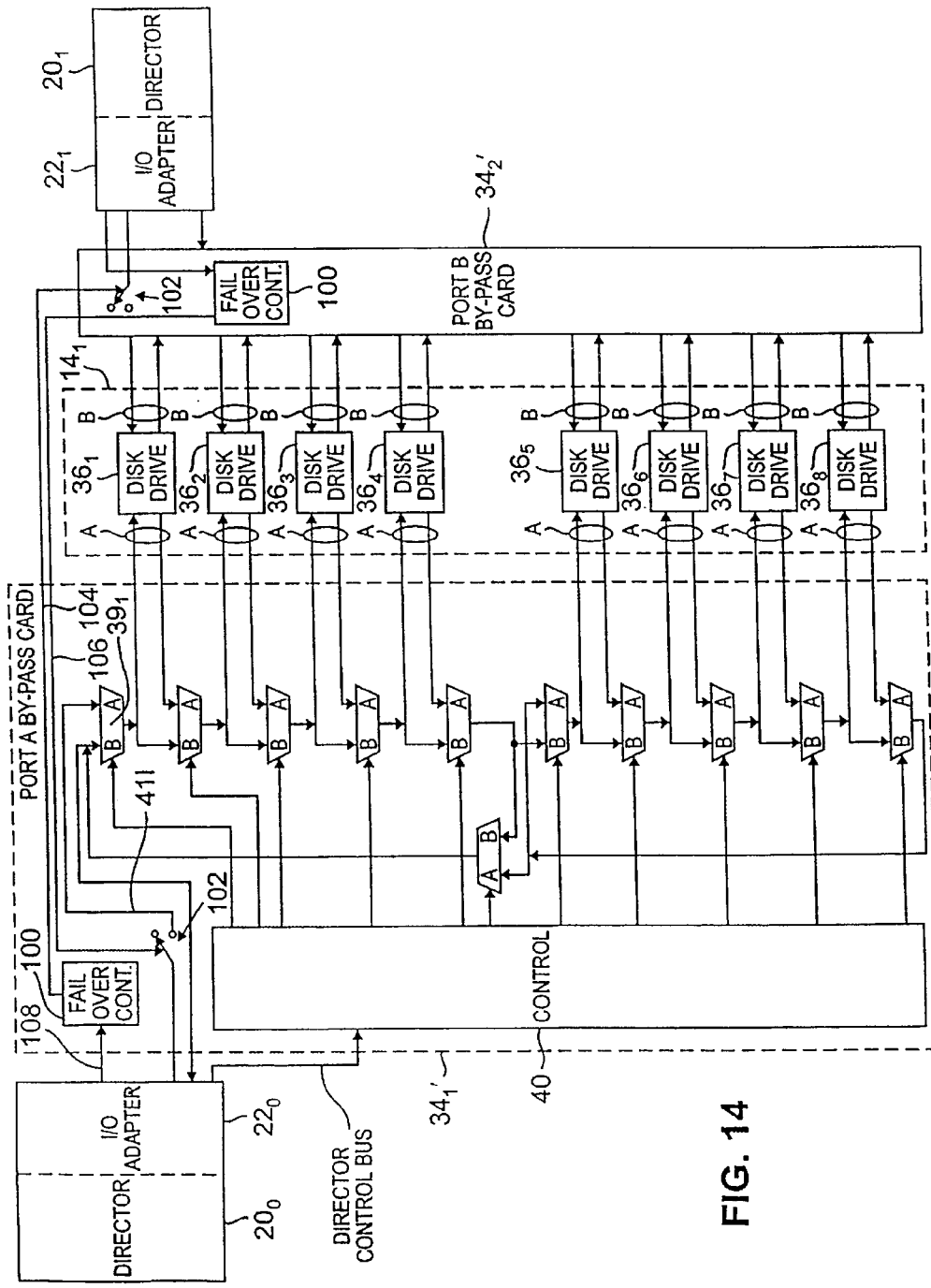
FIG. 14 is a block diagram of a port by-pass section used in the redundant fibre channel network of FIG. 3 coupled to a one of a plurality of disk drive sections in the bank of disk drives used in the system of FIG. 1 according to an alternative embodiment of the invention, such port by-pass section having a pair of port by-pass cards with fail-over control systems according to the invention.

Referring now to FIG. 14, an alternative embodiment of the port by-pass card 34, here exemplary port A by-pass card $34'_1$, is shown in detail together with a B port by-pass card $34'_2$, and the disk drive section $14_1$ coupled to the port A and port B by pass cards $34'_1$ and $34'_2$, as indicated. Each one of the port by-pass cards $34'_1$ and $34'_2$ is identical in construction. Thus, considering the port A by-pass card $34'_1$, it is noted that a fail-over controller 100 is provided together with a fail-over switch 102. The fail-over controller 100 of the port A by-pass card $34'_1$ is used to detect a signal from the director $20_0$ via the I/O adapter $22_0$ indicating that there is some "software" type error, as distinguished from a "hardware" type error, in the operation of the director $20_1$. For example, one type of "software" error in director $20_1$ may cause director $20_1$ to continue to request access to the disk drives in section $14_1$; and such excessive "busy" is detected by director $20_0$. Upon detection of such "software" type error in director $20_1$, the director $20_0$ issues a fail-over command to the fail-over controller 100 in the A port by-pass card $34'_1$. In response to such fail-over command, the fail-over controller 100 of the A port by-pass card $34_1$ produces a switching signal on line 104 for the fail-over switch 102 in the port B by-pass card $34_2$. The switch 102 in the port B by-pass card $34'_2$ opens in response to the switching signal on line 104 thereby de-coupling the director $20_1$ from the disk drives $36_1$ through $36_8$ in the disk drive section $14_1$.

More particularly, the switch 102 is in series with bus $41_1$ described above in connection with FIG. 3. Such bus $41_1$ is, when switch 102 is normally (i.e., during the normal, non-fail-over mode when switch 102 is closed) coupled to the A input of multiplexer $39_1$ as described above in connection with FIG. 3. During the fail-over mode when director $20_0$ detects a "software" failure in director $20_1$ the switch 102 in the port B by-pass card $34'_2$ opens in response to the switching signal on line 104 to de-couple the director $20_1$ from the B ports of the disk drives $36_1$–$36_8$ in the disk drive section $14_1$. In like manner, during a fail-over mode, as when director $20_1$ detects a "software" failure in director $20_0$, the fail-over controller 100 of the port B by-pass card $34'_2$ is used to detect a signal from the director $20_1$ via the I/O adapter $22_1$ indicating that there is some "software" type error, as distinguished from a "hardware" type error, in the operation of the director $20_0$. Upon detection of such "software" type error in director $20_0$, the director $20_1$ issues a fail-over command to the fail-over controller 100 in the port B by-pass card $34'_2$. In response to such fail-over command, the fail-over controller 100 of the port B by-pass card $34_2$ produces a switching signal on line 106 for the fail-over switch 102 in the port A by-pass card $34_1$. The switch 102 in the port A by-pass card $34'_1$, opens in response to the switching signal on line 106 thereby de-coupling the director $20_1$ from the disk drives $36_1$ through $36_8$ in the disk drive section $14_1$.

It is to be noted that the line 104 and 106 are disposed in the disk backplane 54 (FIG. 4).

Thus, the fail-over controllers 100 provide port by-pass control via fail-over commands (e.g., reset and power control). This function is provided to effect a smooth and reliable transition in the case of as director fail-over when one director has to be taken out of the fibre channel "loop". Here, the fail-over controllers 100 are able to process three commands: Card Reset, Card Power Off, and Card Power On. The sequence of these commands is as follows, considering exemplary the fail-over controller 100 of the port A by-pass card $34_1$: The command bus 108 to the fail-over controller 100 of the port A by-pass card $34'_1$ from its associated (i.e., coupled) director $20_0$ must start at Idle. When it is desired to execute a command, a Command Verify command is issued by the associated director $20_0$. Then one of the action commands (Reset, Card Power On, Card Power Off) is issued, followed by an Execute__ <type>command where <type> is the desired action. If this sequence is followed, then when the Execute command is issued, the action will be performed by the remote port by-pass card, here the port B port by-pass card $34'_2$. The bus 108 the returns to Idle.

The command bus 108 that carries these commands has three data bits plus a parity bits form sixteen codes, as described below:

| C2 | C1 | C0 | Parity | Description |
|---|---|---|---|---|
| 0 | 0 | 0 | 0 | Parity Error (PE) |
| 0 | 0 | 0 | 1 | Idle |
| 0 | 0 | 1 | 0 | Card Reset |
| 0 | 0 | 1 | 1 | PE |
| 0 | 1 | 0 | 0 | Card Power Off |
| 0 | 1 | 0 | 1 | PE |
| 0 | 1 | 1 | 0 | PE |
| 0 | 1 | 1 | 1 | Execute Power On |
| 9 | 0 | 0 | 0 | Card Power Off |
| 1 | 0 | 0 | 1 | PE |
| 1 | 0 | 1 | 0 | PE |
| 1 | 0 | 1 | 1 | Execute Power Off |
| 1 | 1 | 0 | 0 | PE |
| 1 | 1 | 0 | 1 | Execute Reset |
| 1 | 1 | 1 | 0 | Command Verify |
| 1 | 1 | 1 | 1 | PE |

Figure 15:
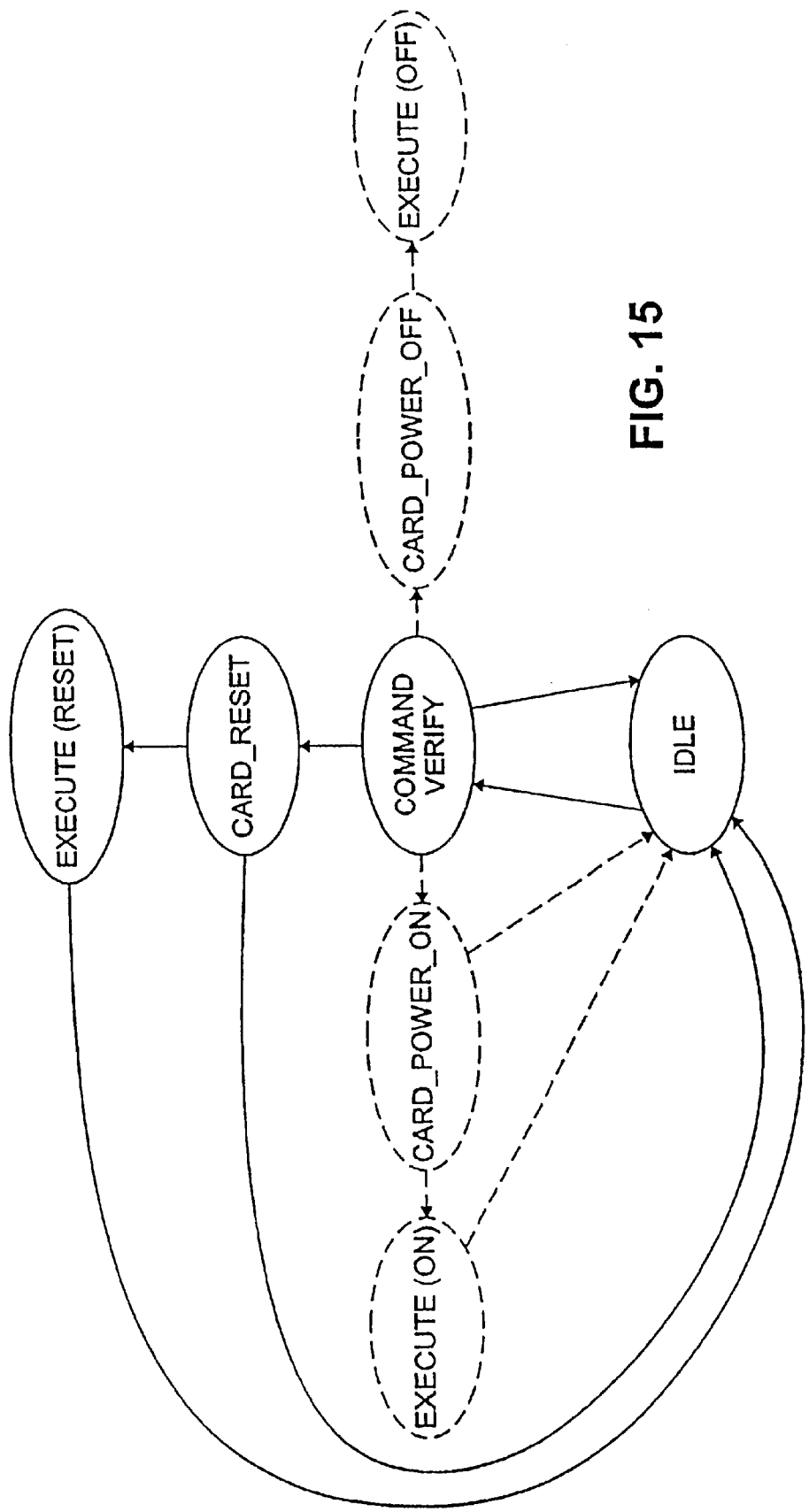
FIG. 15 is a diagram useful in understanding the operation of the port by-pass cards of FIG. 14 with the fail-over control systems according to the invention.

The control sequence is designed to detect hardware failures in the control bus 108 by forcing the bus state from idle (000) to Command Verify (111) to start the command sequence. The actual command of the combination code and the binary inverse (e.g., Card Reset<001> Execute Reset<110>), which can detect any stuck faults, and a parity bit, which provides further protection from invalid codes. Any deviation from the above sequence resets the fail-over controller 100 hardware, and no action is taken. This sequence control provides protection from code faults or execution errors that inadvertently write data to the fail-cover controller 100. The sequence state diagram is shown in FIG. 15.

I/O ADAPTER FIBRE CHANNEL HUBS

REAR-END I/O ADAPTER HUB

Figure 16:
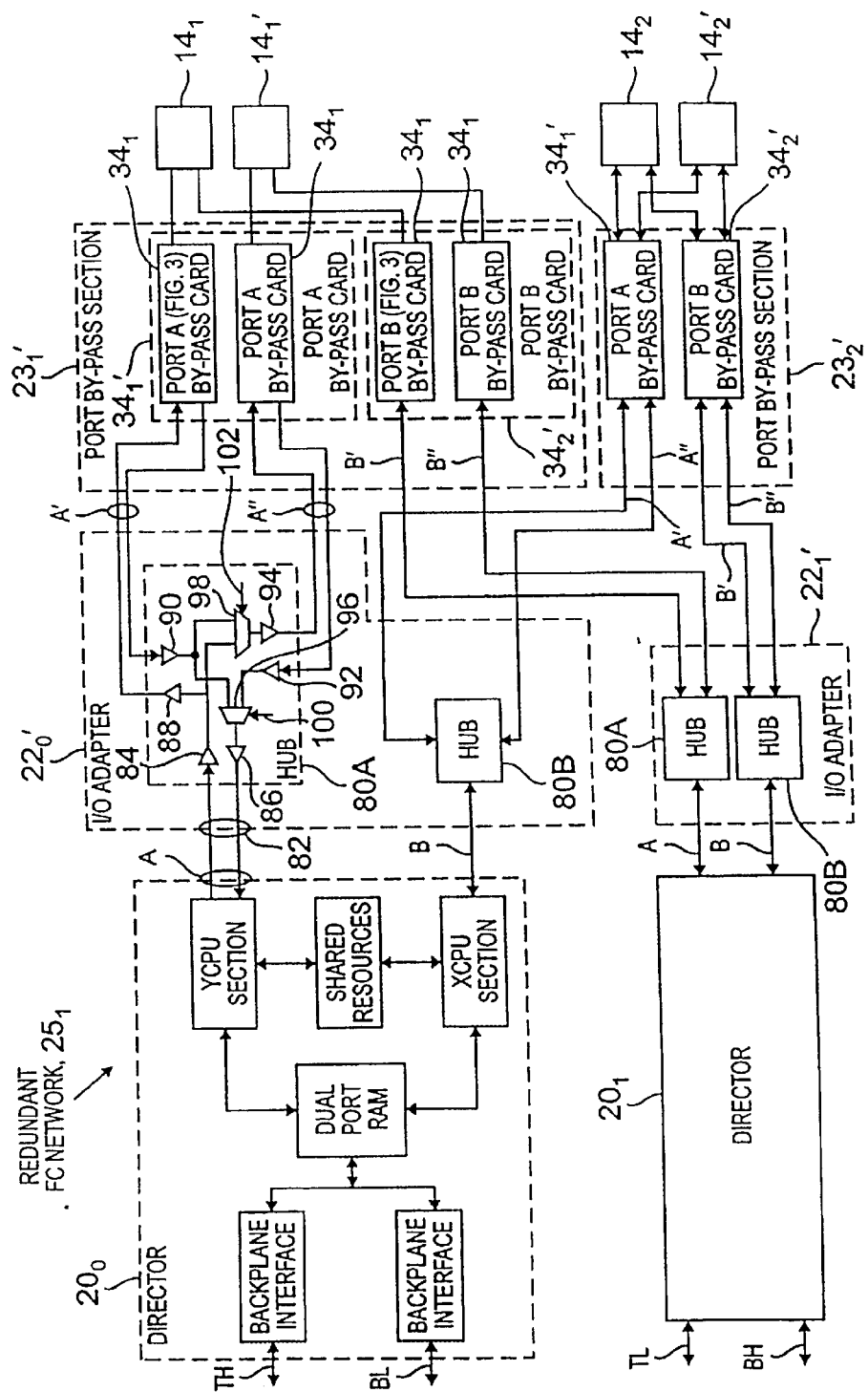
FIG. 16 is a block diagram of a redundant fibre channel network used in the system of FIG. 1, such network having a rear-end I/O adapter with a fibre channel hub according to the invention.

Referring now to FIG. 16, alternative I/O adapters $22'_0$, $22'_1$ and port by-pass sections $23'_1$, $23'_2$ are shown for use in the redundant fibre channel networks $25_1$–$25_4$ (FIG. 1) here, in FIG. 16, being shown for exemplary redundant fibre channel network 25'. Thus, it is noted that the I/O adapters $22'_0$ and $22'_1$ of network $25_1$ each include a pair of fibre channel switching hubs 80A, 80B, as shown. Each one of the hubs 80A and 80B are identical in construction, an exemplary one thereof, here the hub 80A of I/O adapter $22'_0$ being shown in detail. Such hub 80A is shown to include a fibre channel input 82 connected to the A port of the director $20_0$. It is noted that the hub 80B of I/O adapter $22'_0$ is coupled to the B port of director $20_0$. In like manner, the hub 80A of I/O adapter $22_1$ is coupled to the A port of director $20_1$ and the hub 80B of I/O adapter $22'_1$ is coupled to the B port of director $20_1$, as indicated. It should be noted that here the number of disk drives in each disk drive section $14'_1$ and $14'_2$ have doubled from eight to here sixteen (i.e., disk drives $36_1$ to $36_{16}$.

Referring again to exemplary hub 80A of I/O adapter $22'0$, such hub is shown to include drivers 84, 86. 88, 90, 92, and 94 and multiplexers 96 and 98, all arranged as shown. The one of the pair of input ports of the multiplexers 96, 98 is coupled to its output is selected by the control signal fed to lines 100 and 102, respectively, as indicated. Thus, the control signal on line 100 is fed to multiplexer 96 and the control signal on line 102 is fed to multiplexer 102. The control signals on lines 100 and 102 are produced by the director $20_1$ for the hubs 80A and 80B in I/O adapter $22'_0$ and the equivalent control signals for the hubs 80A and 80B of I/O adapters $22'_1$ are produced by the director $20_1$.

Referring now to the port by-pass sections $23'_1$ and $23'_2$, it is first noted that each one is identical in construction, an exemplary one thereof, here section $23'_1$ being shown in detail to include a port A by-pass card $34'_1$ and a port B by-pass card $34'_2$. It is noted that here each port by-pass card $34'_1$ and $34'_2$ includes two redundant ones of the port by-pass cards described above in connection with FIG. 3. Here the upper port A by-pass card $34_1$ services eight disk drives in disk drive section $14_1$ and the lower port A by-pass card $34_1$ services another set of here eight disk drives in disk drive section $14'_1$. Considering the A port of the director $20_0$, it is noted that the hub 80A enables many different coupling configurations with the disk drive sections $14_1$ and $14'_1$ depending on the logic state of the signals provided by the director $20_0$ to control lines 100 and 102 of the multiplexers 96, 98. In a first configuration, the data from the A port of director $20_0$ is passed through driver 84, then through driver 88 then to the upper port A by-pass card $34_1$, then to driver 90 then through multiplexer 100 and back to the A port of the director $20_0$ through driver 86, thus by-passing the lower port A by-pass card $34_1$.

In a second configuration, the data from the A port of director $20_0$ is passed through driver 84, then through multiplexer 102, then through driver 94, then through the lower port A by-pass card $34_1$, then to driver 92 then through multiplexer 100 and back to the A port of the director $20_0$ through driver 86, thus by-passing the upper port A by-pass card $34_1$.

In a third configuration, the data from the A port of director $20_0$ is passed through driver 84, then driver 88 then through the upper port A by-pass card $34_1$, then through driver 90, then through multiplexer 102, then through driver 94, then to the lower A port by-pass card $34_1$, then through driver 92, then through multiplexer 100, then back to the A port of director $20_0$ through driver 86.

FRONT-END I/O ADAPTER HUB

Figure 17:
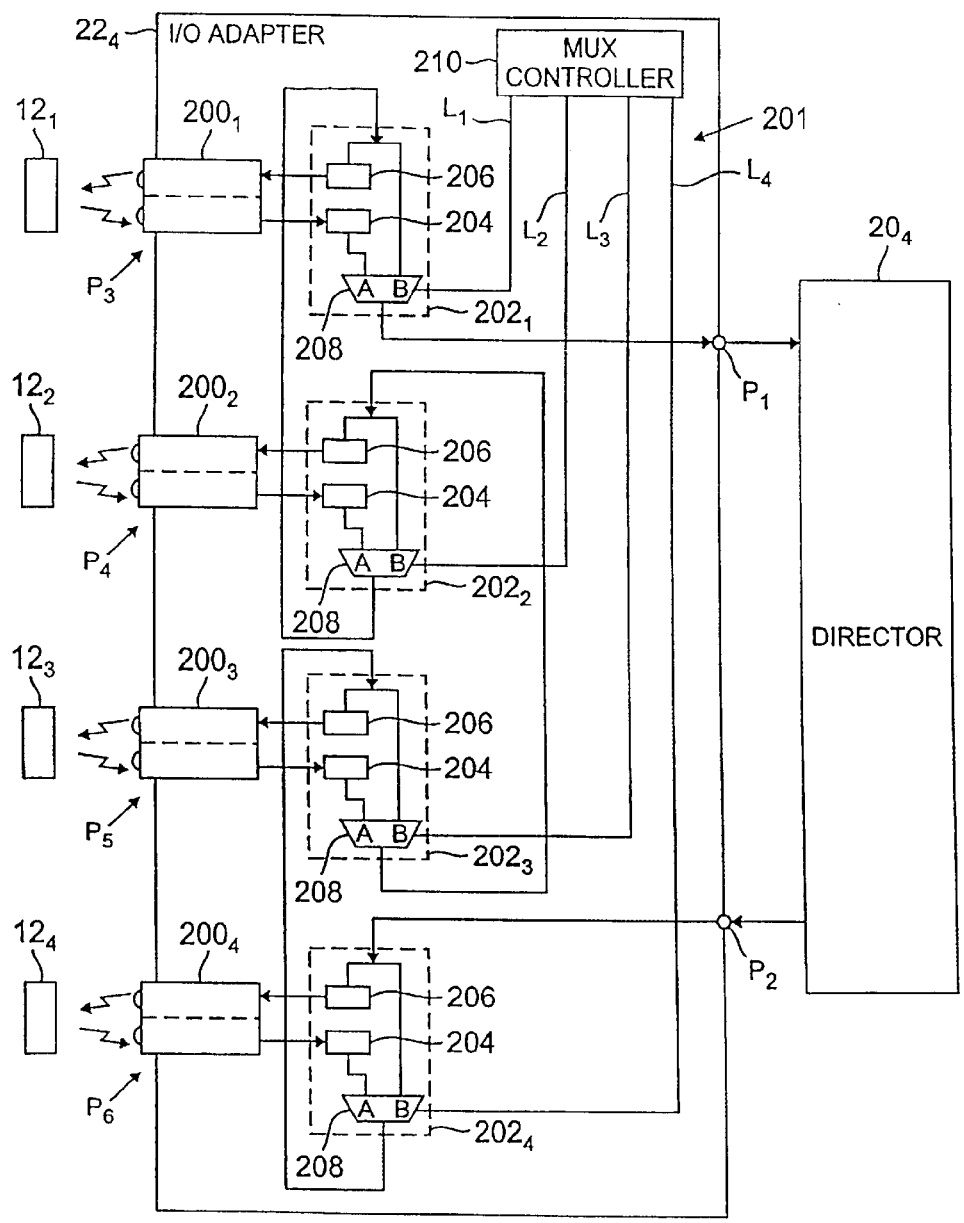
FIG. 17 is a diagram of an exemplary one of a plurality of front-end directors of the system of FIG. 1 coupled to host computer sections through a fibre channel I/O adapter according to the invention.

Referring now to FIG. 17, an exemplary one of the front-end I/O adapters $22_4$–$22_{13}$, here I/O adapter $22_4$ is shown having a pair of ports $P_1$, $P_2$ adapted for coupling to director $20_4$ and a plurality of, here four, ports $P_3$–$P_6$ adapted for communication with the host computer, here four host computer sections $12_1$–$12_4$ of the host computer 12 (FIG. 1) through a fibre channel hub 201. The hub 201 of I/O adapter $22_4$ includes a plurality of electro-optical transceivers $200_1$–$200_4$, each one including a laser for transmitting data to the host computer section coupled thereto and a laser receiver for receiving data from such coupled host computer section. Thus, transceivers $200_1$–$200_4$ are coupled to host computer sections $12_1$–$12_4$, respectively, as indicated. Each one of the transceivers $200_1$–$200_4$ is coupled to a corresponding one of a plurality of, here four, switching sections $202_1$–$202_4$, respectively as indicated. Each one of the switching sections includes a receiver re-timer 204, a transmit re-timer 206 and a multiplexer 208, arranged as shown. Each one of the multiplexers 208 in sections $202_1$–$202_4$ is controlled by control signals on lines L1–L4, respectively as indicated. The control signals on lines L1–L4 are supplied by a multiplexer controller 210. The control signals supplied by the multiplexer controller 210 are produced in accordance with a control signal supplied by the director 204 coupled to the I/O adapter $22_4$.

The arrangement controls the distribution between director $20_4$ and a selected one, or ones of the host computer sections $200_1$–$200_4$. More particularly, and considering data from the director $20_4$ to the data from the director $20_4$, such data passes to an input of multiplexer section $202_4$. The data is able to pass to the transceiver $200_4$ or pass to multiplexer section $202_3$ selectively in accordance with the control signal on line L4. Thus, if it is desired to communicate with host computer section $12_4$, the control signal on line L1 selects port A of multiplexer 208 in section $202_4$. If, on the other hand, such communication is not desired (i.e., host computer section $12_4$ is to be by-passed) the control signal on line L4 causes the data at the B port of the multiplexer 208 of such multiplexer section $202_4$ to pass directly to the output of such section $202_4$.

It is to be noted that when port A is selected to enable communication with the host computer section $12_4$, the data passes to the host computer section $12_4$ via the transmit re-timer 206 and data from the host computer section $12_4$ via the receive re-timer 204.

It should understood that each one of the front-end directors has a pair of ports and therefore the I/O adapter connected to such director has a pair hubs 201 each one being coupled to a corresponding one of the ports of the front-end director.

SIGNAL INTEGRITY TESTER

Figure 18:
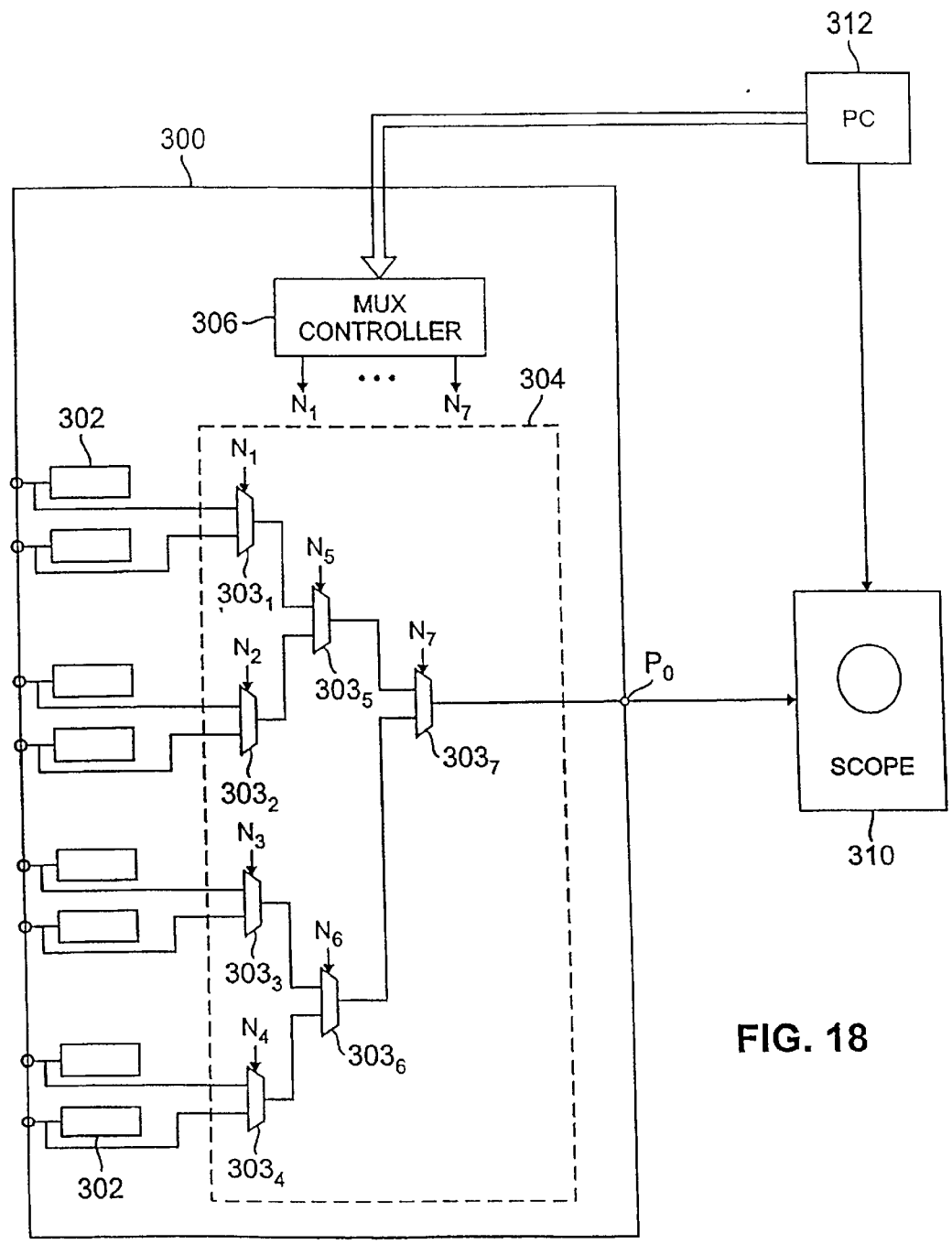
FIG. 18 is a test printed circuit board adapted to test signal integrity in the system of FIG. 1.

Referring now to FIG. 18, a method for testing the signal integrity of the signals on the system backplane 50 (FIG. 4) will be described. Referring again to FIGS. 1 and 4, the directors $20_0$–$20_{15}$ and I/O adapters $22_0$–$22_{15}$ are plugged into an array of slots on opposite sides in the system backplane 50. The arrangement is described in more detail in the above-referenced copending patent application Ser. No. 09/224,194 filed Dec. 30, 1998, entitled DATA STORAGE SYSTEM, inventor Mark Zani.

Figure 19B:
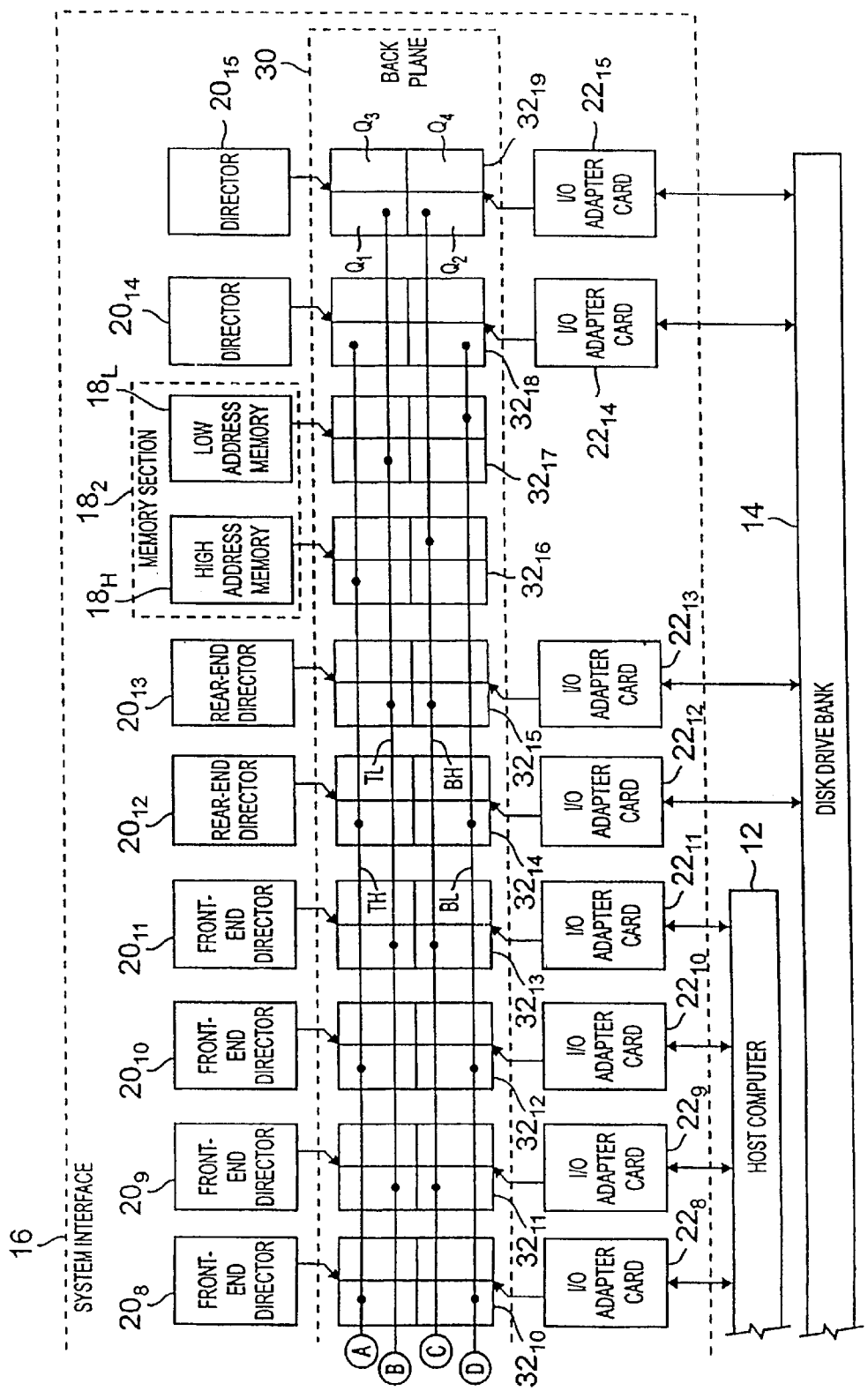
FIG. 19 is a diagram showing the relationship between FIGS. 19A and 19B, such FIGS. 19, 19A and 19B together showing a system interface of the system of FIG. 1.

Referring to FIG. 19, 19A, 19B and 20, diagrams from such copending patent application are shown here for convenience. It is noted that the system backplane $50n$ has a plurality of slots $32_0$–$32_{19}$, the slots in the front surface thereof being adapted to receive the front-end and the rear-end directors and the memories and the slots in the back surface thereof being adapted to receive the front-end and the rear-end I/O adapters. Each slot has a large plurality of pins for receiving the directors, I/O adapters and memories, as shown in FIGS. 18A and 19B. It is also noted that the buses TH, TL, BH, and BL appear to the high-speed data thereon as transmission lines.

Figure 20:
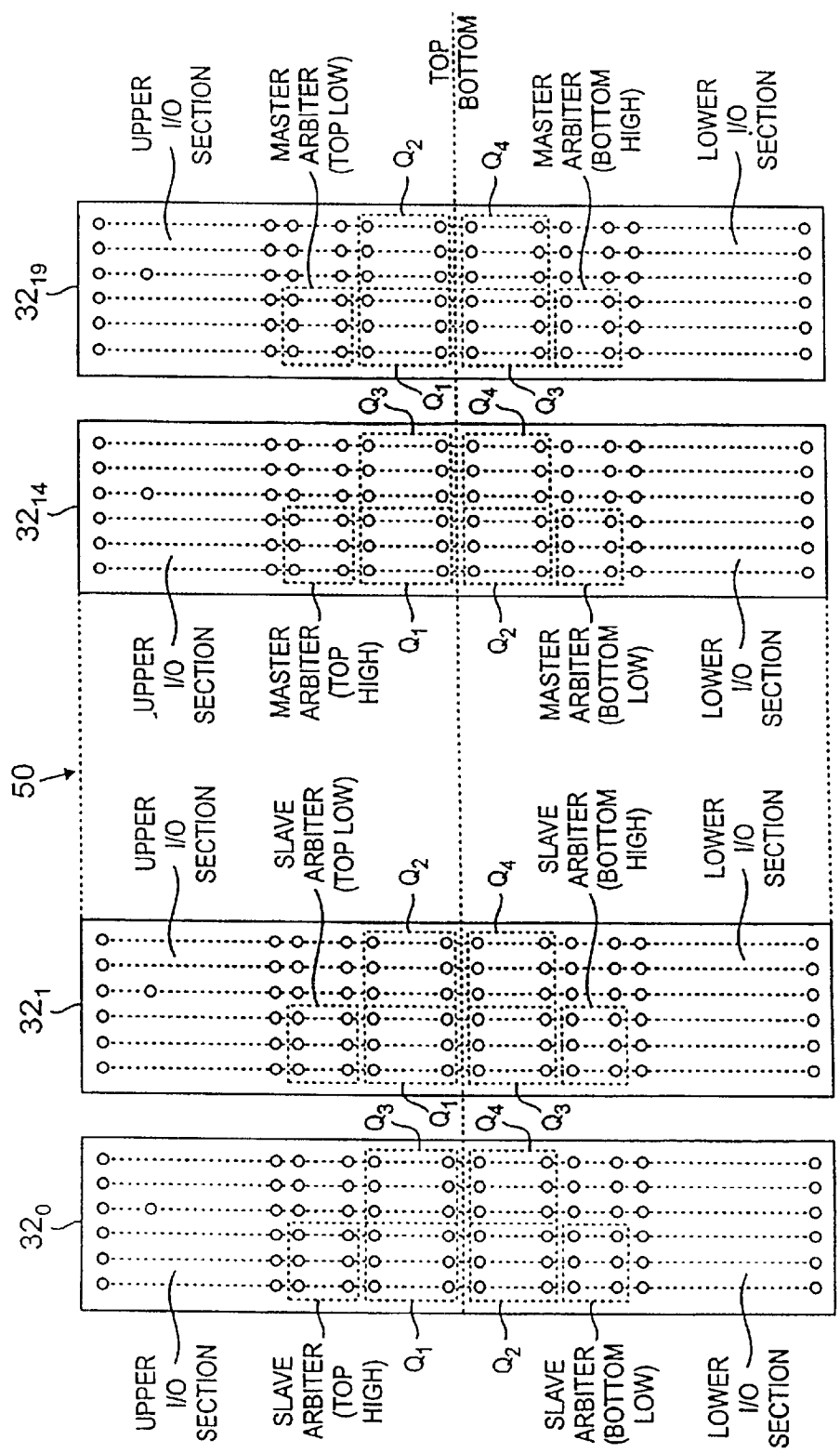
FIG. 20 shows slots used in a system backplane of the interface of FIG. 19, each one of such slots having a plurality of pins, the test printed circuit board of FIG. 18 being adapted to test the integrity of the signal at each one of the pins.

Thus, referring to FIG. 20, the system backplane 50 has typically several hundred pins for each director slot. The following test procedure is used to test the signal integrity at each one of the slots. It should be understood that because of different loading effects at various slots along the busses, the waveform of the signals on a bus would appear slightly different from slot to slot. In order to test whether the signal integrity (i.e., that the waveform of the signal) at each slot on the backplane is acceptable, i.e., within spec, a test board, or card 300 is provided, such test board 300 being shown in FIG. 18. The test board 300 is adapted to replace, during a test mode, each one of the directors and memories and thereby enable the signal waveforms at the pins in the slot occupied by such one of the directors and memories to be examined.

More particularly, the test board 300 is shown to include a plurality of transceivers 302 coupled to each one of the pins of the board 300. The transceivers 302 are coupled to a multiplexer section 304. Here, for simplicity in explanation, the multiplexer section has seven multiplexers $303_1$–$307_7$, it being understood that for several hundred pins there would be a significantly larger number of multiplexers. In any event, the board 300 has a multiplexer control section 306 which produces control signal on line $N_1$–$N_7$ for each one of the multiplexers in the multiplexer section 304. In response to the control signals a selected one of the pins is thereby coupled to an output port $P_O$ of the test card 300. Thus, the signal at each one of the pins can be selectively coupled to the output port $P_O$. The output port $P_O$ is coupled to a scope 310. A personal computer PC 312 is used to control the multiplexer control section 306 and scope 310. Thus, at each slot $32_0$–$32_{19}$ (FIGS. 19, 19A and 19B) the signal at each one of the pins is sequentially examined with the scope 310 and recorded in the PC 312.

During the test mode, the test board 300 is placed in one of the slots $32_0$–$32_{15}$. After testing the signal waveform at each of the pins at that slot, the test board is plugged into a different one of the slots and the process is repeated for the newly positioned test board. The process is repeated until the signal waveform at each one of the pins in at slot and at each one of the slots is individually analyzed with the backplane 50 under fully loaded conditions (i.e., with the directors and memories, other than the director or memory normally in the slot being tested) and the I/O adapters plugged into the system backplane.

Other embodiments are within the spirit and scope of the appended claims.

What is claimed is:

1. A method for testing a data storage system, such system having a host computer coupled to a bank of disk drives through a system interface, such interface comprising a plurality of directors and a memory interconnected by a plurality of busses for controlling data transfer between the host computer and the bank of disk drives as such data passes through the memories, such directors and memory being plugged into a system printed circuit board, a portion of the directors being coupled to the host computer, such method comprising:

providing a test printed circuit board having input ports adapted for plugging into the system printed circuit board, such test printed circuit board having a selector section adapted to couple any one of the inputs thereof to a test output on the test printed circuit board;

a. prior to a test mode, removing one of the directors or memory from the system printed circuit board and replacing such removed one of the directors or memory with the test printed circuit board;

b. operating the system with the test printed circuit board;

c. selectively coupling the inputs of the test printed circuit board to the test output to examine a signal waveform produced at the test output; and d. Repeating steps (a–c).

2. The method recited in claim 1 wherein each one of the directors, memory and the test printed circuit board is adapted to be plugged into a corresponding one of a plurality of slots of the system printed circuit board, each one of the slots having a plurality of pins connected to the busses, and wherein when one of the directors and memories is replaced with the test printed circuit board, a signal at each one of the pins is coupled to the test port and after testing the signal at each of the pins in the slot, the test printed circuit board is removed from such slot, said one of the directors and memory is plugged into such slot, and the test printed circuit board is used to replace another one of the plugged directors and memory.

3. A method for testing a data storage system, such system having a host computer coupled to a bank of disk drives through a system interface, such interface comprising a plurality of directors and a memory interconnected by a plurality of busses for controlling data transfer between the host computer and the bank of disk drives as such data passes through the memory, a front-end portion of the directors being coupled to the host computer through front-end input/output adapters and a rear-end portion of the directors having input/output interfaces coupled to disk drive bank through rear-end input/output adapters, such directors, adapters and memory being plugged into a system printed circuit board, such method comprising:

providing a test printed circuit board having input ports adapted for plugging into a front side of the system printed circuit board, such test printed circuit board having a selector section adapted to couple any one of the inputs thereof to a test output on the test printed circuit board;

a. prior to a test mode, removing a front-end director or the memory from the system printed circuit board and replacing such removed director or memory with the test printed circuit board;

b. operating the system with the test printed circuit board;

c. selectively coupling the inputs of the test printed circuit board to the test output to examine a signal waveform produced at the test output; and d. Repeating steps (a–c).

* * * * *